(12) United States Patent
Mukai

(10) Patent No.: US 9,569,305 B2
(45) Date of Patent: Feb. 14, 2017

(54) MEMORY DEVICE AND CONTROL METHOD OF MEMORY DEVICE

(71) Applicant: SOCIONEXT INC., Yokohama-shi, Kanagawa (JP)

(72) Inventor: Masamichi Mukai, Kasugai (JP)

(73) Assignee: Socionext Inc., Yokohama (JP)

( * ) Notice: Subject to any disclaimer, the term of this patent is extended or adjusted under 35 U.S.C. 154(b) by 44 days.

(21) Appl. No.: 14/510,786

(22) Filed: Oct. 9, 2014

(65) Prior Publication Data
US 2015/0178159 A1    Jun. 25, 2015

(30) Foreign Application Priority Data

Dec. 20, 2013 (JP) ................................. 2013-264282

(51) Int. Cl.
| | | |
|---|---|---|
| G11C 29/00 | (2006.01) | |
| G06F 11/10 | (2006.01) | |
| G11C 8/16 | (2006.01) | |
| G11C 11/419 | (2006.01) | |
| G11C 7/10 | (2006.01) | |

(52) U.S. Cl.
CPC ......... G06F 11/1048 (2013.01); G11C 7/1075 (2013.01); G11C 8/16 (2013.01); G11C 11/419 (2013.01)

(58) Field of Classification Search
None
See application file for complete search history.

(56) References Cited

U.S. PATENT DOCUMENTS

| | | | | |
|---|---|---|---|---|
| 5,959,932 A | * | 9/1999 | MacLellan | G11C 8/16 365/189.05 |
| 6,982,900 B2 | | 1/2006 | Hirabayashi | |
| 7,139,204 B1 | * | 11/2006 | Behera | G11C 29/16 365/201 |
| 8,176,388 B1 | * | 5/2012 | Moshe | G06F 11/106 714/764 |
| 2003/0009721 A1 | * | 1/2003 | Hsu | G06F 11/106 714/773 |
| 2004/0064646 A1 | * | 4/2004 | Emerson | G06F 13/1684 711/131 |
| 2007/0288707 A1 | * | 12/2007 | Tremaine | G06F 13/1684 711/155 |

(Continued)

FOREIGN PATENT DOCUMENTS

| | | |
|---|---|---|
| JP | 2005-222618 A | 8/2005 |
| JP | 2011-054221 A | 3/2011 |

*Primary Examiner* — Daniel McMahon
(74) *Attorney, Agent, or Firm* — Arent Fox LLP

(57) ABSTRACT

A memory device includes: a memory including a first port and a second port that are accessible; an error check and correct encoding circuit that applies an error check and correct code to data and writes them into the first port of the memory; an error check and correct decoding circuit that receives input of the data and the error check and correct code read from the first port of the memory, and corrects the inputted data in case of an error in the inputted data is detected based on the inputted error check and correct code; and a control circuit that writes the corrected data and the error check and correct code into the second port of the memory in case of the error is detected and a current access address and a previous access address to the first port of the memory are different.

9 Claims, 29 Drawing Sheets

(56) References Cited

U.S. PATENT DOCUMENTS

2008/0133994 A1* 6/2008 Oh .................... G06F 11/1008
                                                714/746
2010/0228926 A1* 9/2010 Maheshwari ........ G11C 7/1075
                                                711/149

* cited by examiner

F I G. 7A

| | CYCLE 1 | CYCLE 2 | CYCLE 3 | CYCLE 4 | CYCLE 5 | CYCLE 6 |
|---|---|---|---|---|---|---|
| ADDRESS COMPARISON CIRCUIT | DIFF | SAME | DIFF | DIFF | DIFF | DIFF |
| A-PORT OPERATION MODE | READ | WRITE | READ | READ | READ | READ |
| A-PORT OUTPUT DATA | CHANGED | CHANGED | CHANGED | CHANGED | CHANGED | CHANGED |
| ECC DECODING CIRCUIT | DETECT ONE-BIT ERROR | NO ERROR | DETECT ONE-BIT ERROR | NO ERROR | DETECT ONE-BIT ERROR | NO ERROR |
| B-PORT OPERATION MODE | NOT CORRECT | NOT CORRECT | NOT CORRECT | CORRECT | NOT CORRECT | CORRECT |
| B-PORT CORRECTION PREPARATION | PREPARE | CANCEL | PREPARE | CANCEL | PREPARE | CANCEL |

F I G. 7B

| | CYCLE 1 | CYCLE 2 | CYCLE 3 |
|---|---|---|---|
| ADDRESS COMPARISON CIRCUIT | DIFF | SAME | DIFF |
| A-PORT OPERATION MODE | READ | WRITE | READ |
| A-PORT OUTPUT DATA | CHANGED | NOT CHANGED | CHANGED |
| ECC DECODING CIRCUIT | DETECT ONE-BIT ERROR | KEEP ONE-BIT ERROR | NO ERROR |
| B-PORT OPERATION MODE | NOT CORRECT | NOT CORRECT | WRONG WRITE |
| B-PORT CORRECTION PREPARATION | PREPARE | CANNOT CANCEL | CANCEL |

FIG. 12A

| | CYCLE 1 | CYCLE 2 | CYCLE 3 | CYCLE 4 | CYCLE 5 | CYCLE 6 |
|---|---|---|---|---|---|---|
| ADDRESS COMPARISON CIRCUIT | DIFF | SAME | DIFF | DIFF | DIFF | DIFF |
| A-PORT OPERATION MODE A-PORT OUTPUT DATA | READ CHANGED | WRITE CHANGED | READ CHANGED | READ CHANGED | READ CHANGED | READ CHANGED |
| ECC DECODING CIRCUIT | DETECT ONE-BIT ERROR | NO ERROR | DETECT ONE-BIT ERROR | NO ERROR | DETECT ONE-BIT ERROR | NO ERROR |
| B-PORT OPERATION MODE B-PORT CORRECTION PREPARATION | NOT CORRECT PREPARE | NOT CORRECT CANCEL | NOT CORRECT PREPARE | CORRECT CANCEL | NOT CORRECT PREPARE | CORRECT CANCEL |

FIG. 12B

| | CYCLE 1 | CYCLE 2 | CYCLE 3 | CYCLE 4 | CYCLE 5 | CYCLE 6 |
|---|---|---|---|---|---|---|
| ADDRESS COMPARISON CIRCUIT | DIFF | SAME | DIFF | DIFF | DIFF | DIFF |
| A-PORT OPERATION MODE A-PORT OUTPUT DATA | READ CHANGED | WRITE NOT CHANGED | READ CHANGED | READ CHANGED | READ CHANGED | READ CHANGED |
| ECC DECODING CIRCUIT | DETECT ONE-BIT ERROR | KEEP ONE-BIT ERROR | DETECT ONE-BIT ERROR | NO ERROR | DETECT ONE-BIT ERROR | NO ERROR |
| B-PORT OPERATION MODE B-PORT CORRECTION PREPARATION | NOT CORRECT PREPARE | NOT CORRECT CANCEL | NOT CORRECT PREPARE→CANCEL | NOT CORRECT CANCEL | NOT CORRECT PREPARE | CORRECT CANCEL |

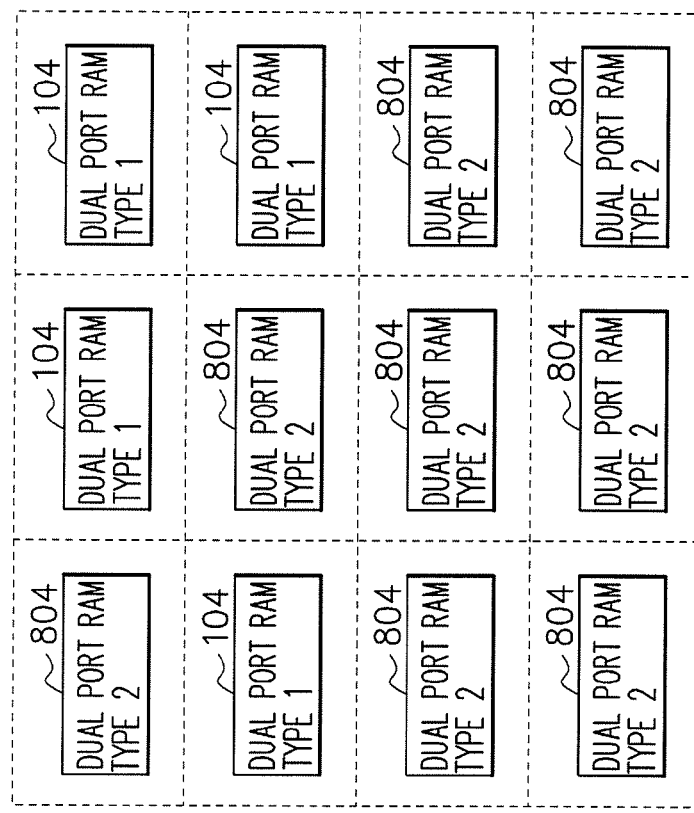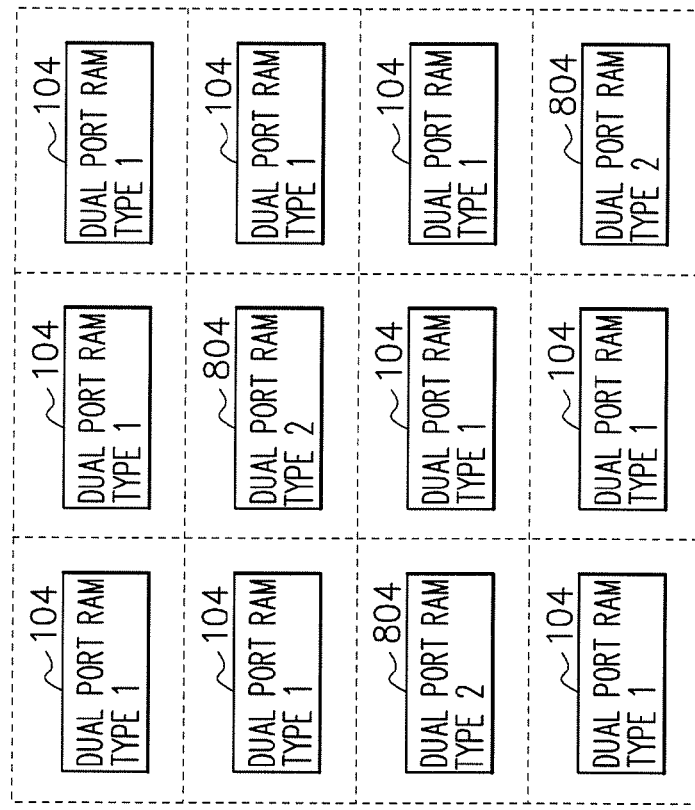

F I G. 19
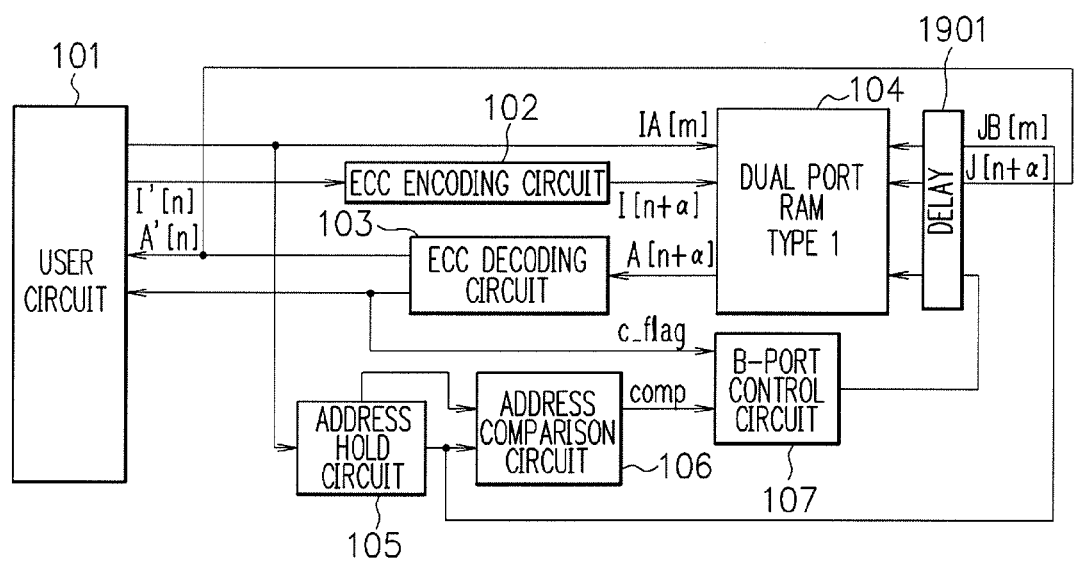
F I G. 20
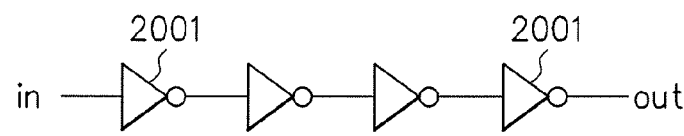

F I G. 24
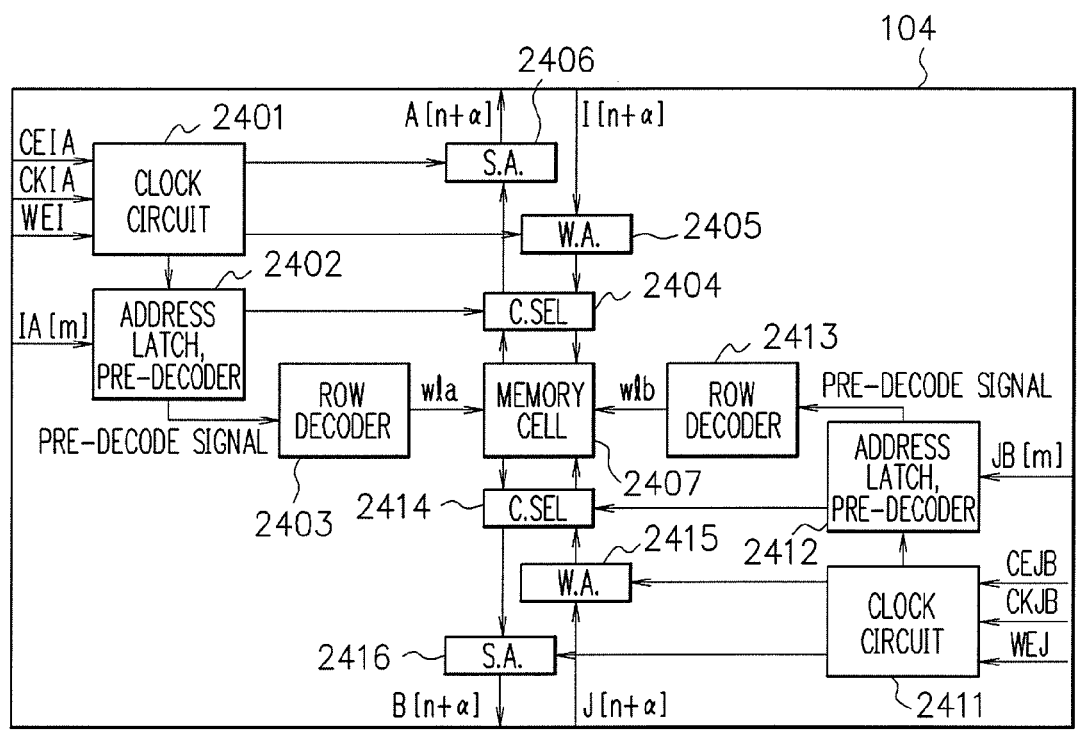

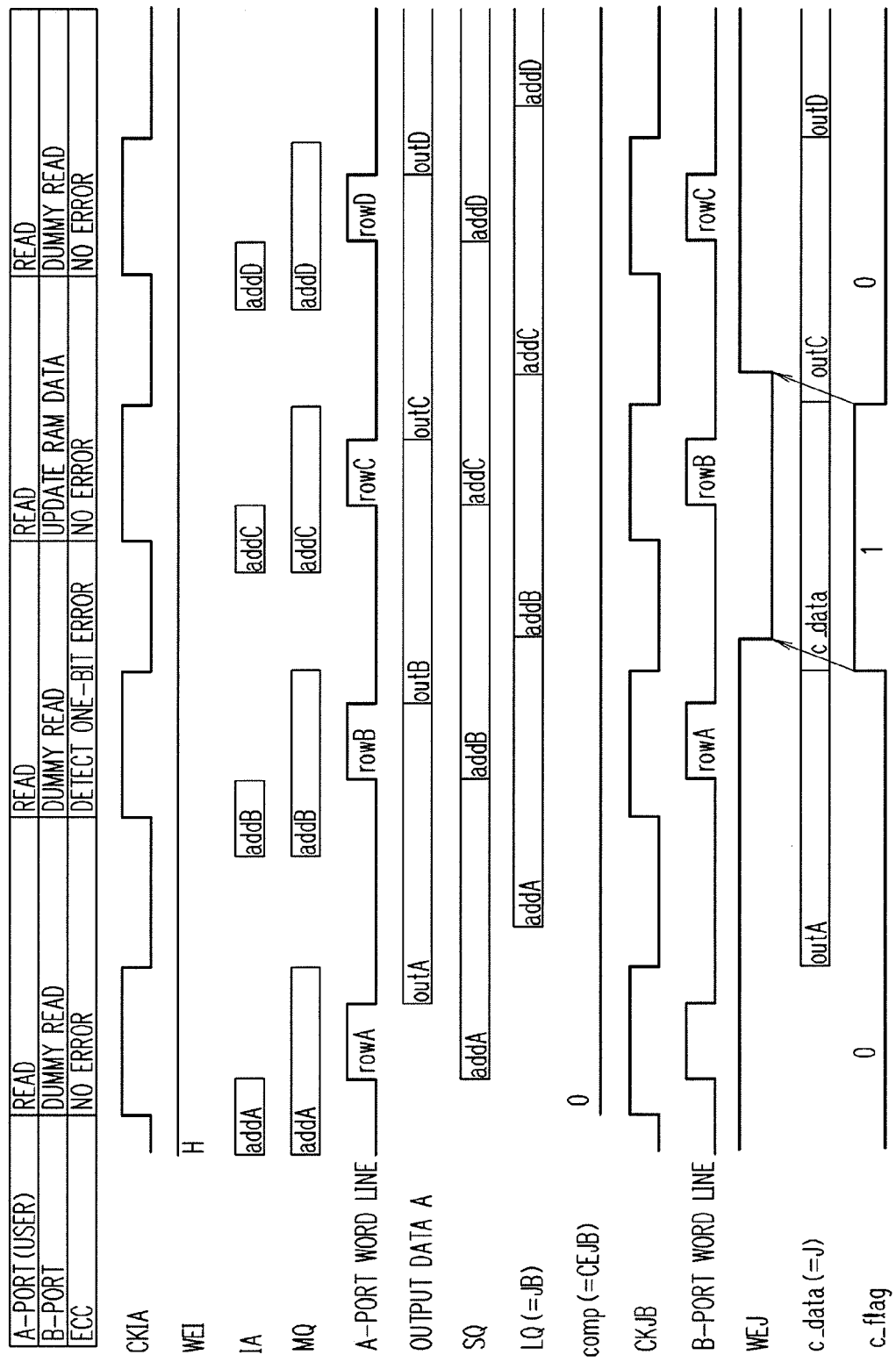
F I G. 27

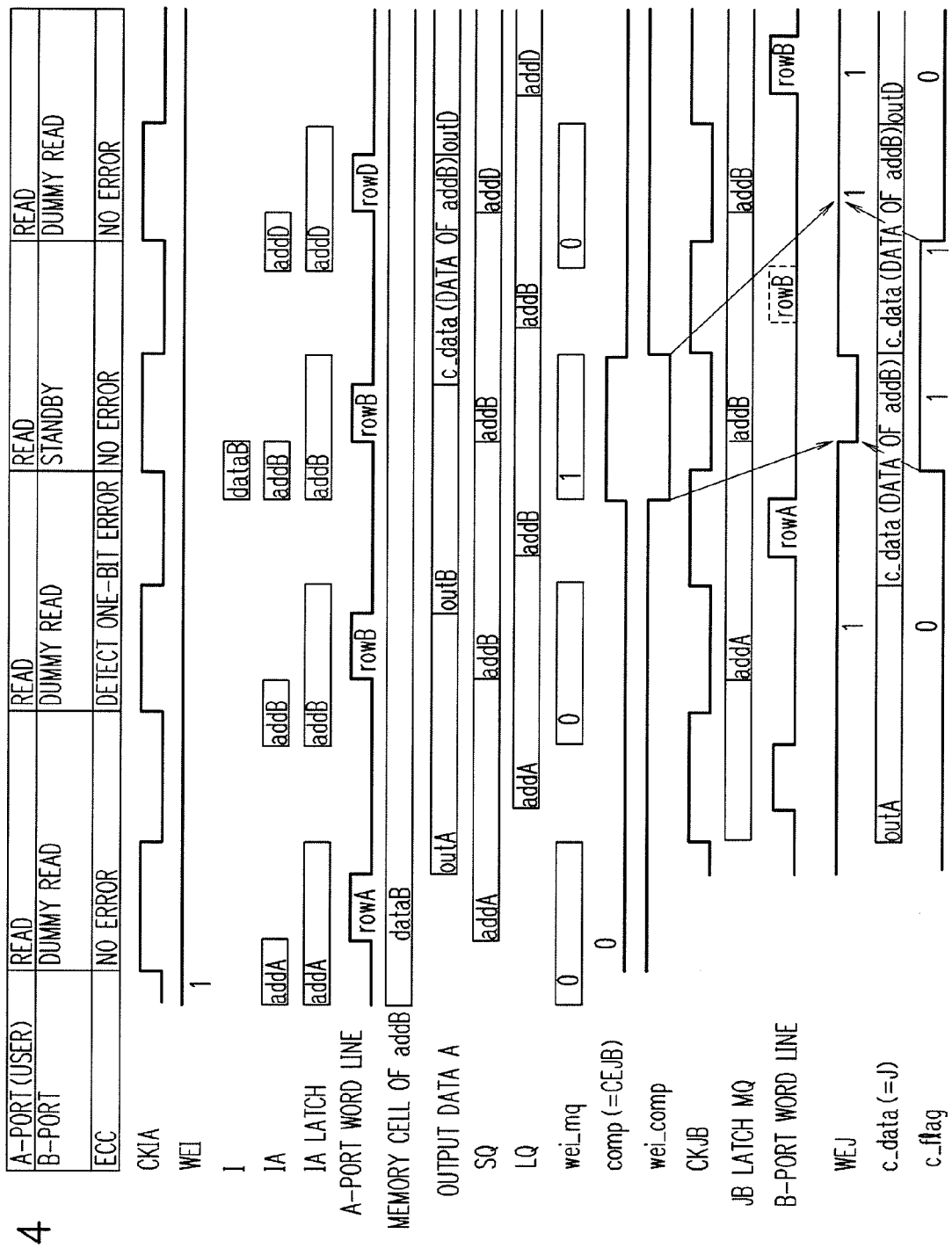
F I G. 34

F I G. 35
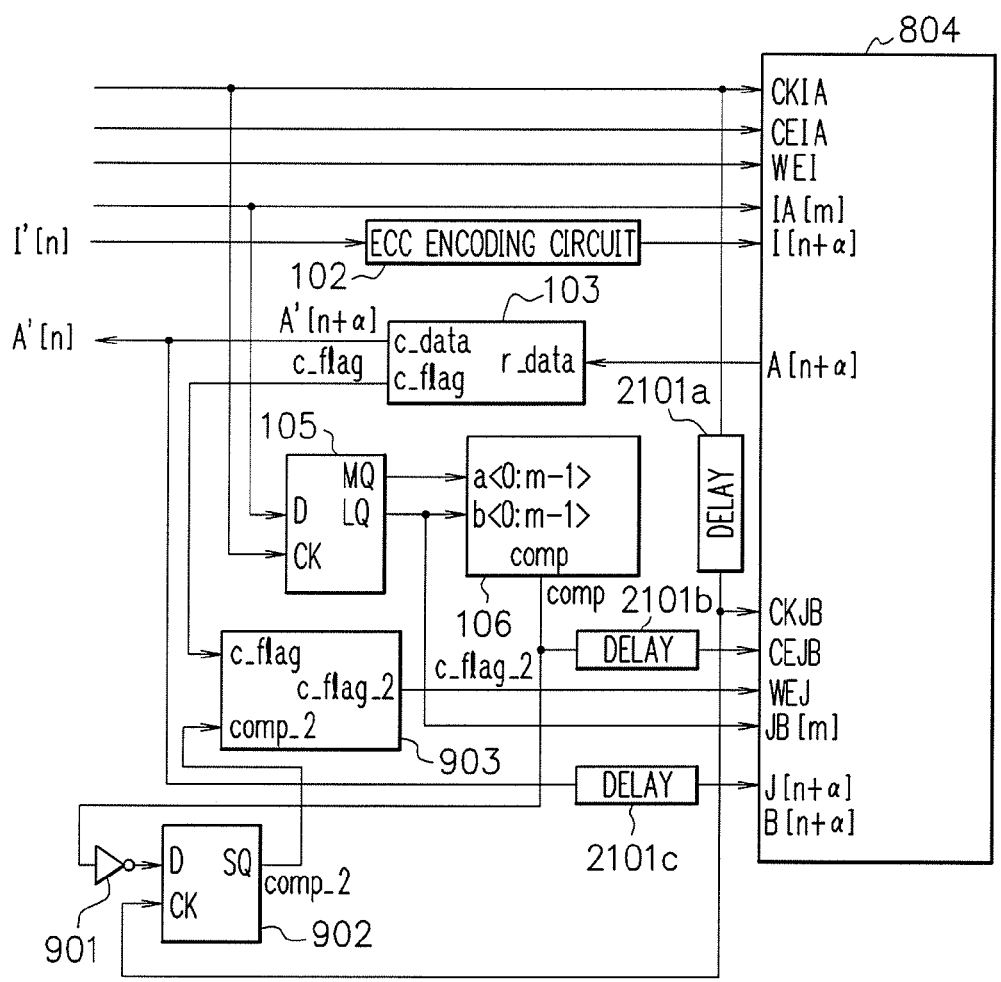

MEMORY DEVICE AND CONTROL METHOD OF MEMORY DEVICE

CROSS-REFERENCE TO RELATED APPLICATION

This application is based upon and claims the benefit of priority of the prior Japanese Patent Application No. 2013-264282, filed on Dec. 20, 2013, the entire contents of which are incorporated herein by reference.

FIELD

The embodiments discussed herein are directed to a memory device and a control method of the memory device.

BACKGROUND

There is a known storage device capable of updating data stored therein on the basis of an address and data inputted from the outside (refer to, for example, Patent Document 1). A memory has a first port for reading data and a second port for writing data. A first data holding unit holds the data read from the memory via the first port on the basis of the address inputted from the outside. The address holding unit holds the address inputted from the outside as an address for writing data via the second port. A second data holding unit holds the data inputted from the outside. A data generation unit generates data to be written into the memory via the second port on the basis of the data held in the first and second data holding units.

There is a known semiconductor integrated circuit device that has a data bit storage memory that stores data bits and a code bit storage memory that stores code bits (refer to, for example, Patent Document 2). An error check and correct (ECC) circuit uses the data bit and the code bit and performs error correction on at least one bit in the data bit or the code bit. The data bit storage memory and the code bit storage memory can be independently controlled. When a data write instruction is received, at least one cycle after the data bit is written into the data bit storage memory, the code bit corresponding to the data bit is written into the code bit storage memory.

[Patent Document 1] Japanese Laid-open Patent Publication No. 2011-54221

[Patent Document 2] Japanese Laid-open Patent Publication No. 2005-222618

An error may occur in the data stored in the memory. The ECC circuit can correct an error of one bit in the data. However, if an error further occurs thereafter and an error of two or more bits exists, the ECC circuit cannot correct the error, resulting in a decrease in reliability of the data.

SUMMARY

A memory device includes: a memory including a first port and a second port that are accessible; an error check and correct encoding circuit that applies an error check and correct code to data and writes the data and the error check and correct code into the first port of the memory; an error check and correct decoding circuit that receives input of the data and the error check and correct code read from the first port of the memory, and corrects the inputted data in case of an error in the inputted data is detected based on the inputted error check and correct code; and a control circuit that does not write the corrected data nor the error check and correct code into the second port of the memory in case of the error is detected and a current access address and a previous access address to the first port of the memory are the same, and writes the corrected data and the error check and correct code into the second port of the memory in case of the error is detected and the current access address and the previous access address to the first port of the memory are different.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7A and FIG. 7B are charts illustrating operation examples of the memory device in FIG. 1;

FIG. 12A and FIG. 12B are charts illustrating operation examples of the memory device in FIG. 8;

FIG. 13A and FIG. 13B are diagrams illustrating mixedly mounting examples of a memory device according to a third embodiment;

FIG. 19 is a diagram illustrating a configuration example of a memory device according to a fourth embodiment;

FIG. 20 is a diagram illustrating a configuration example of a delay circuit;

FIG. 24 is a diagram illustrating a configuration example of the dual port RAM;

FIG. 27 is a timing chart in the case of writing the corrected data;

FIG. 34 is a timing chart in the case of inhibiting writing of the corrected data because of address coincidence;

FIG. 35 is a diagram illustrating a configuration example of a memory device according to a tenth embodiment;

DESCRIPTION OF EMBODIMENTS (First Embodiment)

Figure 1:
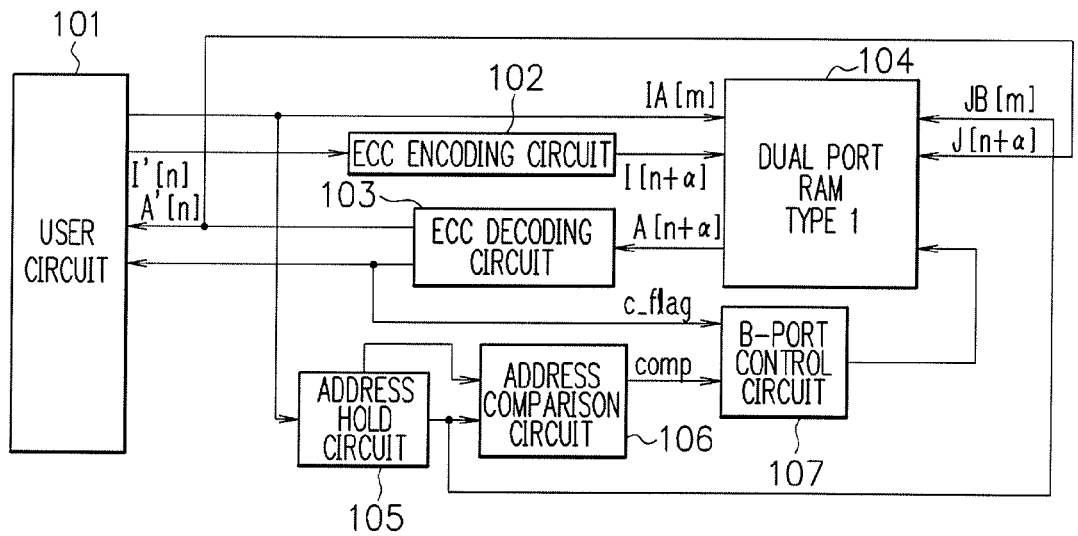
FIG. 1 is diagram illustrating a configuration example of a memory device according to a first embodiment.

FIG. 1 is a diagram illustrating a configuration example of a memory device according to a first embodiment. The memory device has a user circuit 101, an error check and correct (ECC) encoding circuit 102, an ECC decoding circuit 103, a first-type dual port RAM (random access memory) 104, an address hold circuit 105, an address comparison circuit 106, and B-port control circuit 107. The dual port RAM 104 is a memory having an A-port (first port) and a B-port (second port), and the A-port and the B-port are accessible. As for the A-port, the dual port RAM 104 has an input terminal for an m-bit address $IA[m]$ of the A-port, an input terminal for $n+\alpha$-bit input data $I[n+\alpha]$ of the A-port, and an output terminal for $n+\alpha$-bit output data $A[n+\alpha]$ of the A-port. As for the B-port, the dual port RAM 104 has an input terminal for an m-bit address $JB[m]$ of the B-port, an input terminal for $n+\alpha$-bit input data $J[n+\alpha]$ of the B-port, and an input terminal for a control signal of the B-port.

First, a write operation will be described. The user circuit 101 outputs an m-bit address $IA[m]$ for writing, to the input terminal for the address of the A-port of the dual port RAM 104, and outputs n-bit data $I'[n]$ for writing, to the ECC encoding circuit 102. The ECC encoding circuit 102 generates an a-bit ECC code for the data $I'[n]$, and outputs $n+\alpha$-bit data $I[n+\alpha]$ made by applying the $\alpha$-bit ECC code to the data $I'[n]$, to the input terminal for the input data of the A-port of the dual port RAM 104. The dual port RAM 104 writes the data $I[n+\alpha]$ to the address $IA[m]$ at the A-port.

Next, a read operation will be described. The user circuit 101 outputs an m-bit address $IA[m]$ for reading, to the input terminal for the address of the A-port of the dual port RAM 104. The dual port RAM 104 reads the $n+\alpha$-bit data $A[n+\alpha]$ stored in the address $IA[m]$ at the A-port, and outputs the read $n+\alpha$-bit data $A[n+\alpha]$ from the terminal for the output data of the A-port to the ECC decoding circuit 103. The $n+\alpha$-bit data $A[n+\alpha]$ contains the n-bit data and the $\alpha$-bit ECC code corresponding thereto similarly to the above. The ECC decoding circuit 103 receives input of the data $A[n+\alpha]$ read from the A-port of the dual port RAM 104, and checks for an error in the n-bit data in the data $A[n+\alpha]$ on the basis of the $\alpha$-bit ECC code in the data $A[n+\alpha]$. The ECC decoding circuit 103 sets an error flag c_flag to "1" if an error is detected, and resets the error flag c_flag to "0" if no error is detected. If an error is detected, the ECC decoding circuit 103 further corrects the error in the n-bit data in the data $A[n+\alpha]$ on the basis of the a-bit ECC code in the data $A[n+\alpha]$ and outputs $n+\alpha$-bit data $J[n+\alpha]$ containing corrected n-bit data $A'[n]$. The $n+\alpha$-bit data $J[n+\alpha]$ contains the corrected n-bit data $A'[n]$ and the $\alpha$-bit ECC code in the data $A[n+\alpha]$. The user circuit 101 receives input of the corrected n-bit data $A'[n]$ and the error flag c_flag.

The address hold circuit 105 holds the address $IA[m]$, and outputs a previous address $JB[m]$ and a current address $IA[m]$ to the address comparison circuit 106. The address comparison circuit 106 compares the previous address $JB[m]$ and the current address $IA[m]$, and outputs a coincidence signal comp of "1" if they coincide with each other, and outputs a coincidence signal comp of "0" if they do not coincide with each other. The dual port RAM 104 receives input of the previous address $JB[m]$ to the input terminal for the address of the B-port, and the corrected $n+\alpha$-bit data $J[n+\alpha]$ to the input terminal for the input data of the B-port. The B-port control circuit 107 outputs to the dual port RAM 104 a signal enabling writing to the B-port of the dual port RAM 104 if the error flag c_flag is "1" and the coincidence signal comp is "0", and otherwise outputs to the dual port RAM 104 a signal disabling writing to the B-port of the dual port RAM 104. Upon receiving from the B-port control circuit 107 input of the signal enabling writing, the dual port RAM 104 writes the corrected $n+\alpha$-bit data $J[n+\alpha]$ to the previous address $JB[m]$ at the B-port.

If the previous address $JB[m]$ and the current address $IA[m]$ are the same, the writing of the previous address $JB[m]$ to the B-port and the access of the current address $IA[m]$ to the A-port collide at the same address in the same cycle, so that the B-port control circuit 107 disables the writing to the B-port of the dual port RAM 104 to avoid collision.

An error may occur in the data stored in the dual port RAM 104. The ECC decoding circuit 103 can correct an error of one bit in the n-bit data in the data $A[n+\alpha]$. However, when an error further occurs thereafter and an error of two or more bits exists, the ECC decoding circuit 103 cannot correct the error.

According to the present invention, if an error is detected in the data $A[n+\alpha]$ read from the dual port RAM 104 in the read operation, it is possible to prevent an error of two or more bits by writing the corrected data $J[n+\alpha]$ so as to improve the reliability of data.

Further, the B-port control circuit 107 controls the writing to the B-port of the dual port RAM 104, thereby making it possible to improve the operation throughput as compared with the case of writing the corrected data after a user temporarily stops the memory device from the outside.

Figure 2:
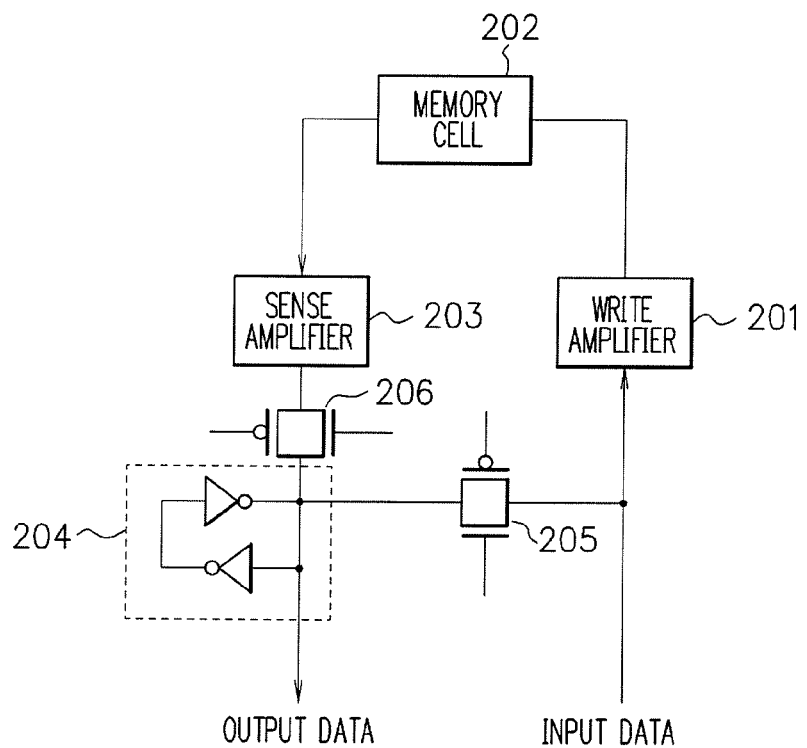
FIG. 2 is a diagram illustrating a configuration example of a part of a first-type dual port RAM.

FIG. 2 is a diagram illustrating a configuration example of a part of the first-type dual port RAM 104 in FIG. 1. First, the read operation will be described. In the case of a read instruction, a transmission gate 205 turns off, and a transmission gate 206 turns on. A memory cell 202 outputs data read from a designated address to an output latch circuit 204 via a sense amplifier 203 and the transmission gate 206. The output latch circuit 204 outputs latched data as the output data $A[n+\alpha]$.

Next, the write operation will be described. In the case of a write instruction, the transmission gate 205 turns on, and the transmission gate 206 turns off. In the case of writing, the input data $I[n+\alpha]$ is written into the memory cell 202 via a write amplifier 201. Further, the input data I[n+α] is outputted to the output latch circuit 204 via the transmission gate 205. The output latch circuit 204 outputs the latched data as the output data A[n+α].

As described above, the first-type dual port RAM 104 outputs the data read from the memory cell 202 as the output data A[n+α] in the case of reading, and outputs the input data I[n+α] as the output data A[n+α] in the case of writing.

The ECC decoding circuit 103 in FIG. 1 makes an error check only when the output data A[n+α] has been changed, and updates the error flag c_flag. Accordingly, when the output data A[n+α] has been changed by the read operation, the error flag c_flag is updated. Further, when the output data A[n+α] has been changed by the write operation, the error flag c_flag is updated.

Figure 3:
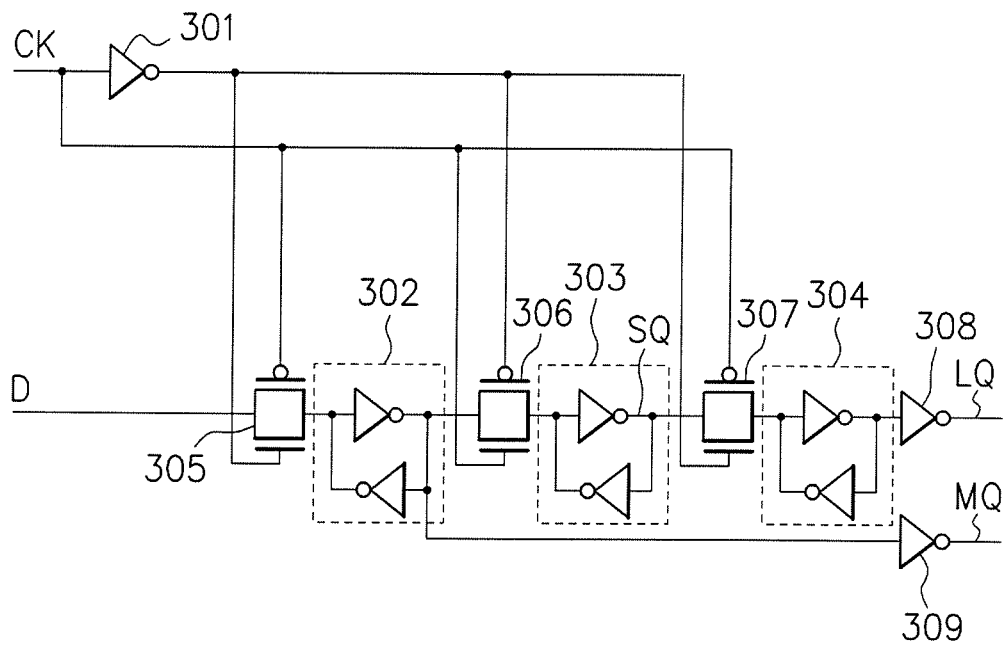
FIG. 3 is a diagram illustrating a configuration example of an address hold circuit.

FIG. 3 is a diagram illustrating a configuration example of the address hold circuit 105 in FIG. 1. An inverter 301 outputs a logical inversion signal of a clock signal CK. A transmission gate 305 receives input of the address IA[m] in FIG. 1 as input data D, and turns on when the clock signal CK is at low level and turns off when the clock signal CK is at high level. A master latch circuit 302 has two inverters, latches an output signal of the transmission gate 305, and outputs a logical inversion signal of the output signal. A transmission gate 306 receives input of an output signal of the master latch circuit 302, and turns on when the clock signal CK is at high level and turns off when the clock signal CK is at low level. A slave latch circuit 303 has two inverters, latches an output signal of the transmission gate 306, and outputs a logical inversion signal SQ of the output signal. A transmission gate 307 receives input of the output signal SQ of the slave latch circuit 303, and turns on when the clock signal CK is at low level and turns off when the clock signal CK is at high level. A lockup latch circuit 304 has two inverters, latches an output signal of the transmission gate 307, and outputs a logical inversion signal of the output signal. An inverter 308 outputs a logical inversion signal LQ of an output signal of the lockup latch circuit 304 as the previous address JB[m] (FIG. 1). An inverter 309 outputs a logical inversion signal MQ of the output signal of the master latch circuit 302 as the current address. The address comparison circuit 106 in FIG. 1 compares the previous address LQ and the current address MQ as to whether they coincide with each other.

Figure 4:
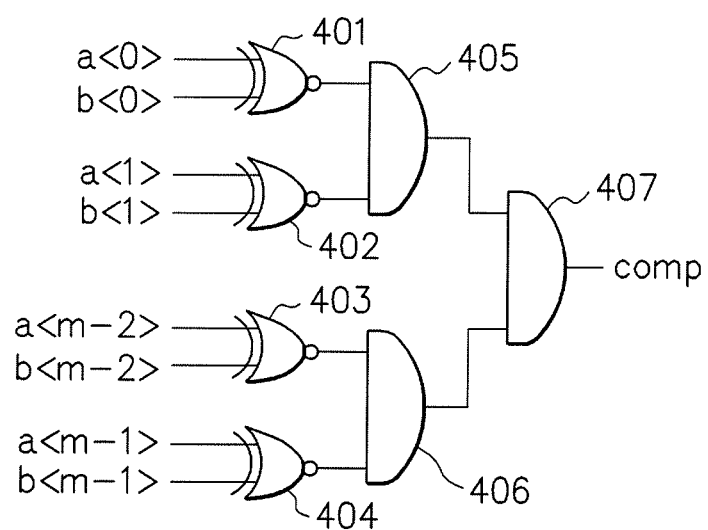
FIG. 4 is a diagram illustrating a configuration example of an address comparison circuit.

FIG. 4 is a diagram illustrating a configuration example of the address comparison circuit 106 in FIG. 1, and describing an example of comparing four bit addresses (m=4) for a simple explanation. Four bit addresses a<0>, a<1>, a<m−2>, a<m−1> correspond to the current address MQ. Four bit addresses b<0>, b<1>, b<m−2>, b<m−1> correspond to the previous address LQ. An exclusive negative logical sum circuit 401 outputs "1" if the addresses a<0> and b<0> are the same, and outputs "0" if they are different. An exclusive negative logical sum circuit 402 outputs "1" if the addresses a<1> and b<1> are the same, and outputs "0" if they are different. An exclusive negative logical sum circuit 403 outputs "1" if the addresses a<m−2> and b<m−2> are the same, and outputs "0" if they are different. An exclusive negative logical sum circuit 404 outputs "1" if the addresses a<m−1> and b<m−1> are the same, and outputs "0" if they are different. A logical product (AND) circuit 405 outputs a logical product signal of output signals of the exclusive negative logical sum circuits 401 and 402. A logical product circuit 406 outputs a logical product signal of output signals of the exclusive negative logical sum circuits 403 and 404. A logical product circuit 407 outputs a logical product signal of output signals of the logical product circuits 405 and 406, as the coincidence signal comp. The coincidence signal comp becomes "1" if the current address a<0>, a<1>, a<m−2>, a<m−1> and the previous address b<0>, b<1>, b<m−2>, b<m−1> are the same, and the coincidence signal comp becomes "0" if they are different.

Figure 5:
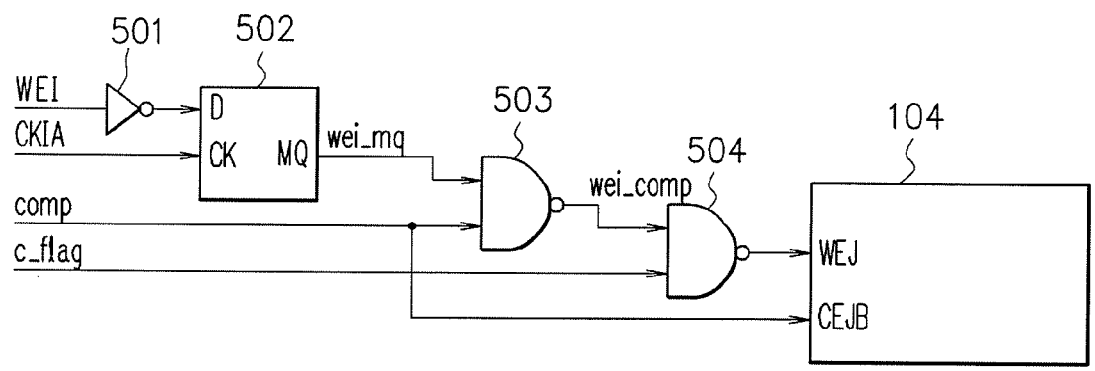
FIG. 5 is a diagram illustrating a configuration example of a B-port control circuit.

FIG. 5 is a diagram illustrating a configuration example of the B-port control circuit 107 in FIG. 1. An inverter 501 outputs a logical inversion signal of a write enable signal WEI of the A-port. A register 502 latches an output signal of the inverter 501 in synchronization with a clock signal CKIA of the A-port, and outputs a signal wei_mq. A negative logical product (NAND) circuit 503 outputs a negative logical product signal wei_comp of the coincidence signal comp and the signal wei_mq. A negative logical product circuit 504 outputs a negative logical product signal of the error flag c_flag and the signal wei_comp, as a write enable signal WEJ of the B-port to the dual port RAM 104. The coincidence signal comp is outputted as a chip enable signal CEJB of the B-port to the dual port RAM 104. If the error flag c_flag is "1" and the coincidence signal comp is "0", the write enable signal WEJ of the B-port becomes "0" and the chip enable signal CEJB of the B-port becomes "0", and the B-port control circuit 107 instructs writing of the corrected data to the B-port of the dual port RAM 104. Otherwise, the B-port control circuit 107 prohibits writing of the corrected data to the B-port of the dual port RAM 104.

Figure 6:
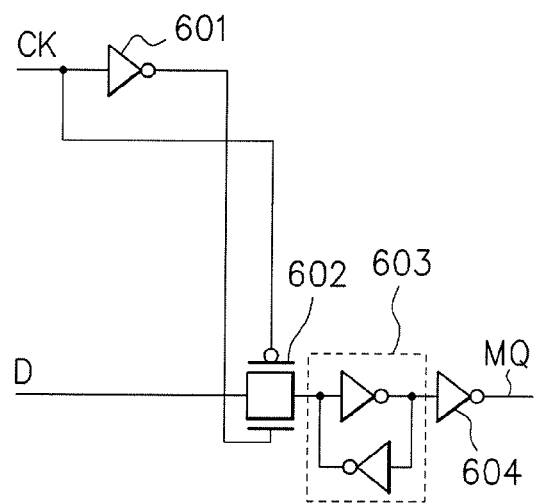
FIG. 6 is a diagram illustrating a configuration example of a register.

FIG. 6 is a diagram illustrating a configuration example of the register 502 in FIG. 5. The clock signal CK corresponds to the clock signal CKIA in FIG. 5. The input data D corresponds to the output signal of the inverter 501 in FIG. 5. The output data MQ corresponds to the signal wei_mq in FIG. 5. An inverter 601 outputs a logical inversion signal of the clock signal CK. A transmission gate 602 receives input of the input data D, and turns on when the clock signal CK is at low level and turns off when the clock signal CK is at high level. A master latch circuit 603 has two inverters, latches an output signal of the transmission gate 602, and outputs a logical inversion signal of the output signal. An inverter 604 outputs the logical inversion signal MQ of an output signal of the master latch circuit 603.

FIG. 7A is a chart illustrating an operation example of the memory device in FIG. 1. First, in a first cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in the next cycle is "1", the B-port control circuit 107 does not write the corrected data to the B-port of the dual port RAM 104 in this cycle, but prepares to write the corrected data in the next cycle.

Then, in a second cycle, the address comparison circuit 106 outputs the coincidence signal comp of "1" as address coincidence. The A-port of the dual port RAM 104 performs a write operation according to a write command. By the write operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the coincidence signal comp is "1", the B-port control circuit 107 does not write the corrected data to the B-port of the dual port RAM 104. Further, since the error flag c_flag in the next cycle is "0", the B-port control circuit 107 cancels the preparation to write the corrected data in the next cycle.

Then, in a third cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in this cycle is "0", the B-port control circuit 107 does not write the corrected data to the B-port of the dual port RAM 104. Further, since the error flag c_flag in the next cycle is "1", the B-port control circuit 107 prepares to write the corrected data in the next cycle.

Then, in a fourth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the coincidence signal comp is "0" and the error flag c_flag in this cycle is "1", the B-port control circuit 107 writes the corrected data to the B-port of the dual port RAM 104. Further, since the error flag c_flag in the next cycle is "0", the B-port control circuit 107 cancels the preparation to write the corrected data in the next cycle.

Then, in a fifth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in this cycle is "0", the B-port control circuit 107 does not write the corrected data to the B-port of the dual port RAM 104. Further, since the error flag c_flag in the next cycle is "1", the B-port control circuit 107 prepares to write the corrected data in the next cycle.

Then, in a sixth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the coincidence signal comp is "0" and the error flag c_flag in this cycle is "1", the B-port control circuit 107 writes the corrected data to the B-port of the dual port RAM 104. Further, since the error flag c_flag in the next cycle is "0", the B-port control circuit 107 cancels the preparation to write the corrected data in the next cycle.

As described above, if the error in the output data A[n+α] of the A-port of the dual port RAM 104 is detected, the corrected data is written to the B-port of the dual port RAM 104 in the next cycle. In this event, if the previous address and the current address coincide with each other and the coincidence signal comp thus becomes "1", writing of the corrected data is not performed to avoid collision of accesses to the same address. In contrast, if the previous address and the current address do not coincide with each other and the coincidence signal comp thus becomes "0", the corrected data is written.

According to this embodiment, if the error in the output data A[n+α] of the dual port RAM 104 is detected, the corrected data J[n+α] is written, thereby making it possible to prevent an error of two or more bits so as to improve the reliability of data.

Further, the B-port control circuit 107 controls writing to the B-port of the dual port RAM 104, thereby making it possible to improve the operation throughput as compared with the case of writing the corrected data after the user temporarily stops the memory device from the outside.

(Second Embodiment)

Figure 8:
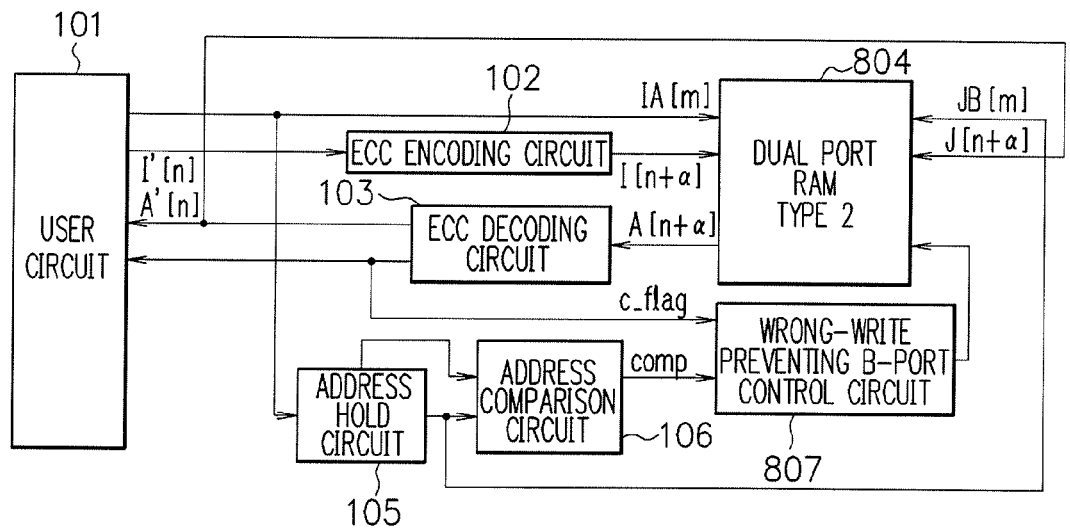
FIG. 8 is a diagram illustrating a configuration example of a memory device according to a second embodiment.

FIG. 8 is a diagram illustrating a configuration example of a memory device according to a second embodiment. This embodiment (FIG. 8) is made by providing a dual port RAM 804 and a B-port control circuit 807 in place of the dual port RAM 104 and the B-port control circuit 107, with respect to the first embodiment (FIG. 1). Hereinafter, the points of this embodiment different from the first embodiment will be described.

The second-type dual port RAM 804 is provided in place of the first-type dual port RAM 104. In the second-type dual port RAM 804, the transmission gate 205 in FIG. 2 is eliminated. Hereinafter, the operation of the second-type dual port RAM 804 will be described. The read operation of the second-type dual port RAM 804 is the same as that of the first-type dual port RAM 104. Next, the write operation will be described. In the case of a write instruction, the latch data of the output latch circuit 204 is not changed and the output data A[n±α] of the output latch circuit 204 is not changed because there is no transmission gate 205.

FIG. 7B is a chart illustrating an operation example of the memory device in FIG. 1 when the dual port RAM 104 in FIG. 1 is replaced with the second-type dual port RAM 804. First, in a first cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in the next cycle is "1", the B-port control circuit 107 does not write the corrected data to the B-port of the dual port RAM 804 in this cycle, but prepares to write the corrected data in the next cycle.

Then, in a second cycle, the address comparison circuit 106 outputs the coincidence signal comp of "1" as address coincidence. The A-port of the dual port RAM 804 performs a write operation according to a write command. By the write operation, the output data A[n+α] of the A-port is not changed. Since the output data A[n+α] has not been changed, the ECC decoding circuit 103 does not make an error check on the output data A[n+α], but keeps the error flag c_flag of "1". Since the coincidence signal comp is "1", the B-port control circuit 107 does not write the corrected data to the B-port of the dual port RAM 804. Further, since the error flag c_flag keeps "1", the B-port control circuit 107 cannot cancel the preparation to write the corrected data in the next cycle.

Then, in a third cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "1" and the coincidence signal comp is "0", the B-port control circuit 107 will write the corrected data of the read data in the first cycle over at the same address as the address of the data written to the A-port in the second cycle. This will erase the write data in the second cycle, and therefore the writing of the corrected data to the B-port in the third cycle is wrong write.

The memory device in this embodiment (FIG. 8) can perform appropriate control for the second-type dual port RAM 804.

Figure 9:
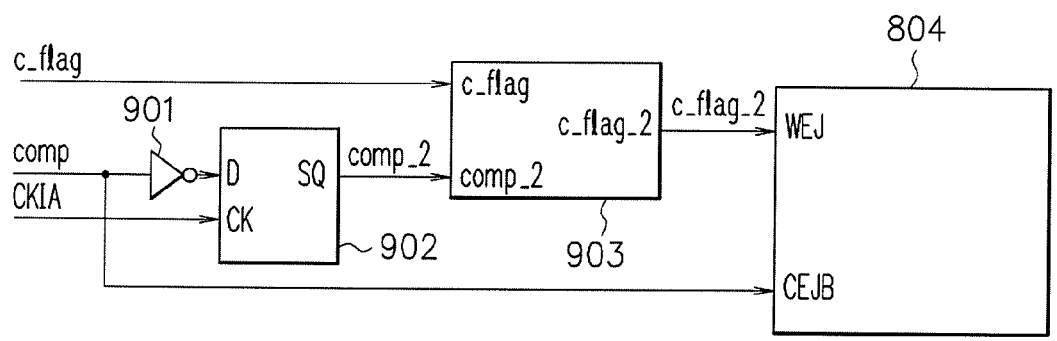
FIG. 9 is a diagram illustrating a configuration example of the B-port control circuit.

FIG. 9 is a diagram illustrating a configuration example of the B-port control circuit 807 in FIG. 8. An inverter 901 outputs a logical inversion signal of the coincidence signal comp. A register 902 latches an output signal of the inverter 901 in synchronization with the clock signal CKIA of the A-port, and outputs a coincidence signal comp_2. The coincidence signal comp_2 is a logical inversion signal of the coincidence signal comp. A write enable control circuit 903 receives input of the error flag c_flag and the signal comp_2, and outputs a signal c_flag_2 as the write enable signal WEJ of the B-port to the dual port RAM 804. Further, the coincidence signal comp is outputted as the chip enable signal CEJB of the B-port to the dual port RAM 804.

Figure 10:
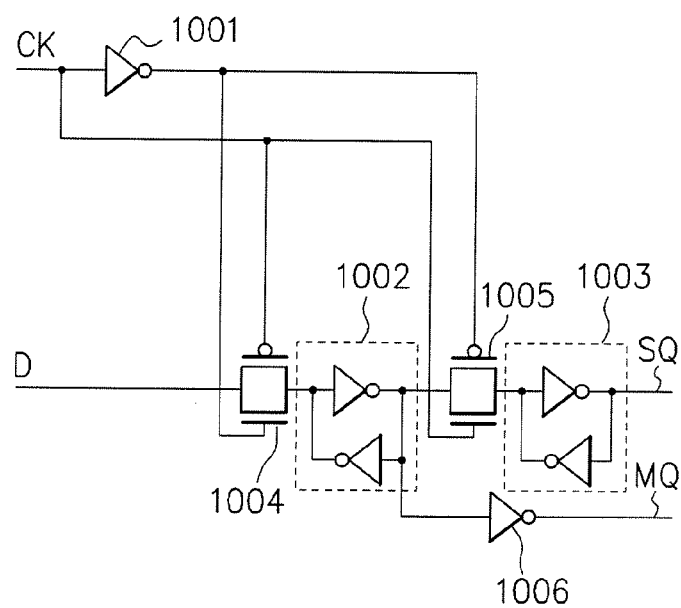
FIG. 10 is a diagram illustrating a configuration example of the register.

FIG. 10 is a diagram illustrating a configuration example of the register 902 in FIG. 9. The clock signal CK corresponds to the clock signal CKIA in FIG. 9. The input data D corresponds to the output signal of the inverter 901 in FIG. 9. The output data SQ corresponds to the coincidence signal comp_2 in FIG. 9. An inverter 1001 outputs a logical inversion signal of the clock signal CK. A transmission gate 1004 receives input of the input data D, and turns on when the clock signal CK is at low level and turns off when the clock signal CK is at high level. A master latch circuit 1002 has two inverters, latches an output signal of the transmission gate 1004, and outputs a logical inversion signal of the output signal. A transmission gate 1005 receives input of an output signal of the master latch circuit 1002, and turns on when the clock signal CK is at high level and turns off when the clock signal CK is at low level. A slave latch circuit 1003 has two inverters, latches an output signal of the transmission gate 1005, and outputs a logical inversion signal SQ of the output signal. An inverter 1006 outputs a logical inversion signal MQ of an output signal of the master latch circuit 1002.

Figure 11:
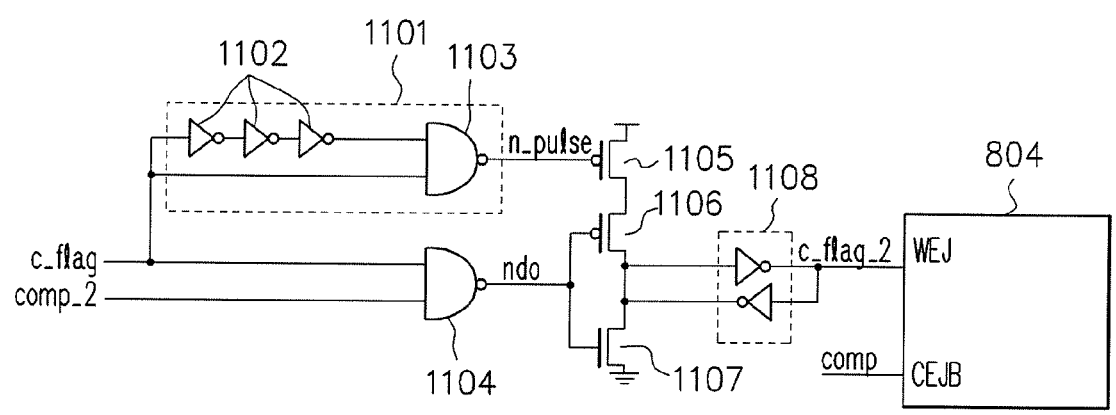
FIG. 11 is a diagram illustrating a configuration example of a write enable control circuit.

FIG. 11 is a diagram illustrating a configuration example of the write enable control circuit 903 in FIG. 9. A chopper circuit 1101 has an odd number of inverters 1102 and a negative logical product circuit 1103, and generates a negative pulse signal n_pulse at rising of the error flag c_flag. A negative logical product circuit 1104 outputs a negative logical product signal ndo of the error flag c_flag and the coincidence signal comp_2. A p-channel field effect transistor 1105 has a source connected to a power supply potential node and a gate connected to a node of the pulse signal n_pulse. A p-channel field effect transistor 1106 has a source connected to a drain of the transistor 1105 and a gate connected to the node of the signal ndo. An n-channel field effect transistor 1107 has a drain connected to the drain of the transistor 1106, a gate connected to the node of the signal ndo, and a source connected to a ground potential node. A latch circuit 1108 has two inverters, latches a drain signal of the transistor 1106, and outputs a logical inversion signal c_flag_2 of the drain signal as the write enable signal WEJ of the B-port to the dual port RAM 804. Further, the coincidence signal comp is outputted as the chip enable signal CEJB of the B-port to the dual port RAM 804.

The transistor 1105 turns on only at the rising of the error flag c_flag. In the state where no one-bit error occurs, the error flag c_flag is "0", the signal ndo is "1", and the signal c_flag_2 is "1". In this case, the write enable signal WEJ of the B-port becomes "1", so that the dual port RAM 804 does not write the corrected data to the B-port.

Further, in the state where addresses coincide with each other, the coincidence signal comp_2 is "0", the signal ndo is "1", and the signal c_flag_2 is "1". In this case, the write enable signal WEJ of the B-port becomes "1", so that the dual port RAM 804 does not write the corrected data to the B-port.

Further, in the state where addresses do not coincide with each other, the coincidence signal comp_2 is "1", the error flag c_flag is "1" when a one-bit error has been detected, the signal ndo is "0", and the transistor 1106 turns on. Further, at the rising of the error flag c_flag, the signal n_pulse becomes a negative pulse, and the transistor 1105 turns on for a short pulse period. When the transistors 1105 and 1106 turn on, the signal c_flag_2 becomes "0". Further, the coincidence signal comp becomes "0". In this case, since the write enable signal WEJ of the B-port becomes "0" and the chip enable signal CEJB of the B-port becomes "0", so that the dual port RAM 804 writes the corrected data to the B-port.

FIG. 12A is a chart illustrating an operation example of the memory device in FIG. 8 when the dual port RAM 804 in FIG. 8 is replaced with the first-type dual port RAM 104. The operation in FIG. 12A is the same operation as that in FIG. 7A, in which a normal operation is performed.

FIG. 12B is a chart illustrating an operation example of the memory device in FIG. 8 using the second-type dual port RAM 804. First, in a first cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in the next cycle is changed from "0" to "1", the B-port control circuit 807 does not write the corrected data to the B-port of the dual port RAM 804 in this cycle, but prepares to write the corrected data in the next cycle.

Then, in a second cycle, the address comparison circuit 106 outputs the coincidence signal comp of "1" as address coincidence. The A-port of the dual port RAM 804 performs a write operation according to a write command. By the write operation, the output data A[n+α] of the A-port is not changed. Since the output data A[n+α] has not been changed, the ECC decoding circuit 103 does not make an error check on the output data A[n+α], but keeps the error flag c_flag of "1". Since the coincidence signal comp is "1", the B-port control circuit 807 does not write the corrected data to the B-port of the dual port RAM 804. Further, since the error flag c_flag keeps "1", the B-port control circuit 807 cancels the preparation to write the corrected data in the next cycle.

Then, in a third cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and keeps the error flag c_flag of "1". Since the error flag c_flag keeps "1", the B-port control circuit 807 does not write the corrected data to the B-port of the dual port RAM 804. Further, since the error flag c_flag keeps "1", the B-port control circuit 807 cancels the preparation to write the corrected data in the next cycle. In this cycle, the wrong write as in the third cycle in FIG. 7B can be prevented.

Then, in a fourth cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle keeps "1", the B-port control circuit 807 does not write the corrected data to the B-port of the dual port RAM 804. Further, since the error flag c_flag in the next cycle is "0", the B-port control circuit 807 cancels the preparation to write the corrected data in the next cycle.

Then, in a fifth cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in this cycle is "0", the B-port control circuit 807 does not write the corrected data to the B-port of the dual port RAM 804. Further, since the error flag c_flag in the next cycle is changed from "0" to "1", the B-port control circuit 807 prepares to write the corrected data in the next cycle.

Then, in a sixth cycle, the address comparison circuit 106 outputs the coincidence signal comp of "0" as address non-coincidence. The A-port of the dual port RAM 804 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the coincidence signal comp is "0" and the error flag c_flag in this cycle has been changed from "0" to "1", the B-port control circuit 807 writes the corrected data to the B-port of the dual port RAM 804. Further, since the error flag c_flag in the next cycle is "0", the B-port control circuit 807 cancels the preparation to write the corrected data in the next cycle.

As described above, in the second-type dual port RAM 804, the output data A[n+α] is not changed at the write operation and the ECC decoding circuit 103 does not make an error check. Therefore, at the write operation in the second cycle, the previous error flag c_flag of "1" is not changed but kept. In this embodiment, only when the error flag c_flag has been changed from "0" to "1", the writing of the corrected data to the B-port is enabled, the wrong write as in FIG. 7B can be prevented.

(Third Embodiment)

FIG. 13A is a diagram illustrating a mixedly mounting example of a memory device according to a third embodiment, and FIG. 13B is a diagram illustrating another mixedly mounting example of the memory device according to the third embodiment, in each of which first-type dual port RAMs 104 and second-type dual port RAMs 804 are mixedly mounted. In this embodiment, it is identified which one of the first-type dual port RAM 104 and the second-type dual port RAM 804 a dual port RAM is, and if it is the first-type dual port RAM 104, the operation in the first embodiment is performed, whereas if it is the second-type dual port RAM 804, the operation in the second embodiment is performed.

Figure 14:
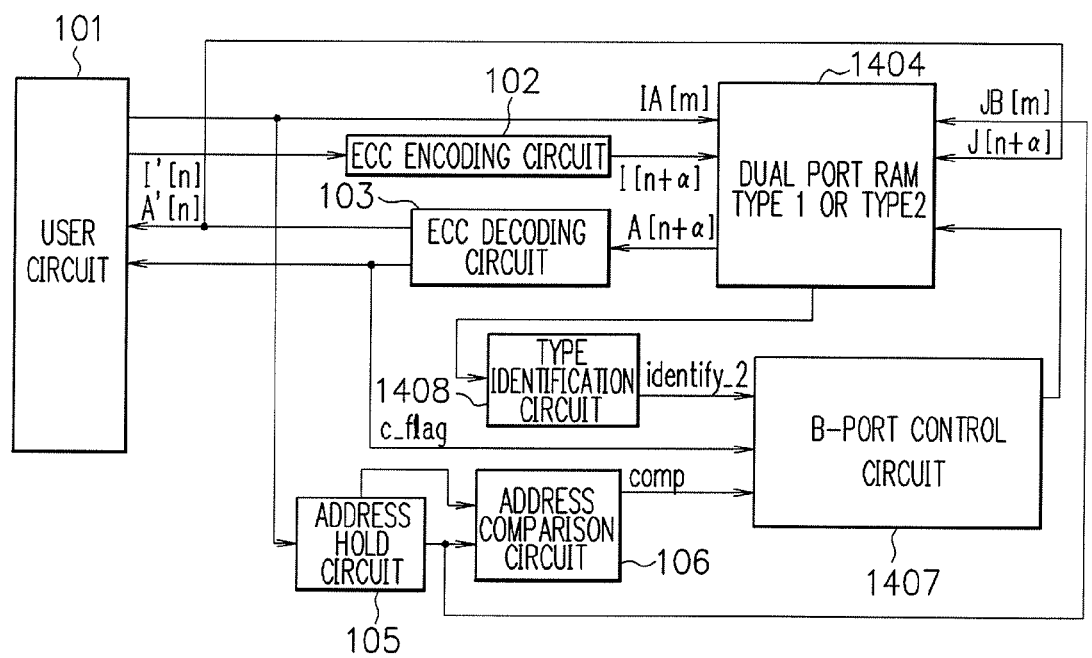
FIG. 14 is a diagram illustrating a configuration example of the memory device according to the third embodiment.

FIG. 14 is a diagram illustrating a configuration example of the memory device according to the third embodiment. This embodiment (FIG. 14) is made by providing a dual port RAM 1404 and a B-port control circuit 1407 in place of the dual port RAM 104 and the B-port control circuit 107 and adding a type identification circuit 1408, with respect to the first embodiment (FIG. 1). Hereinafter, the points of this embodiment different from the first embodiment will be described.

The dual port RAM 1404 is either the first-type dual port RAM 104 or the second-type dual port RAM 804. The type identification circuit 1408 receives input of the input data I[n+α] and the output data A[n+α] and so on of the A-port from the dual port RAM 1404, identifies which one of the first-type dual port RAM 104 and the second-type dual port RAM 804 the dual port RAM 1404 is, and outputs an identification signal identify_2. The B-port control circuit 1407 receives input of the error flag c_flag, the coincidence signal comp, and the identification signal identify_2, and performs the same control as that of the B-port control circuit 107 in the first embodiment if the identification signal identify_2 indicates the first-type dual port RAM 104, and performs the same control as that of the B-port control circuit 807 in the second embodiment if the identification signal identify_2 indicates the second-type dual port RAM 804.

Figure 15:
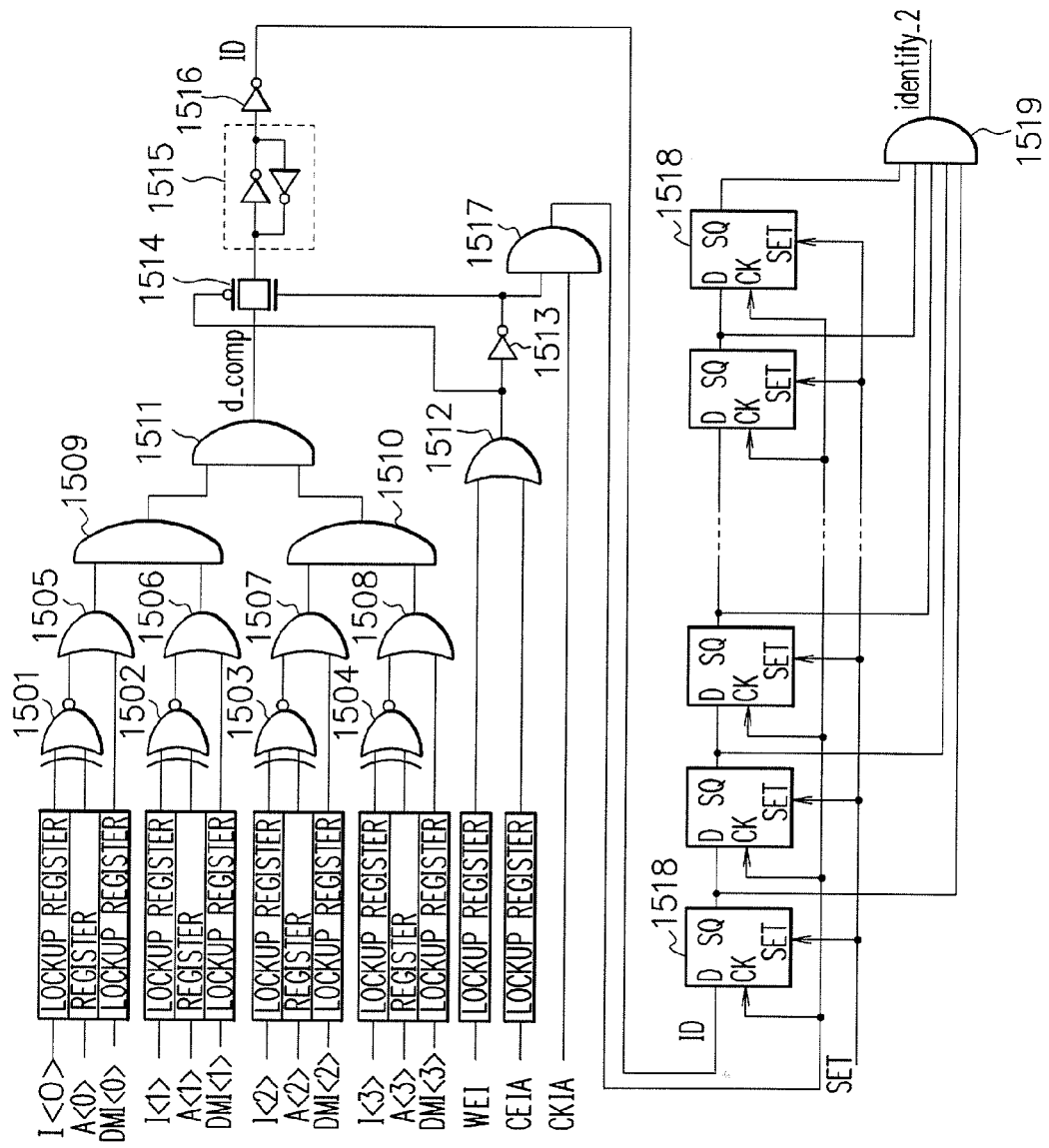
FIG. 15 is a diagram illustrating a configuration example of a type identification circuit.

FIG. 15 is a diagram illustrating a configuration example of the type identification circuit 1408 in FIG. 14. Four bit input data I<0> to I<3> correspond to the input data I[n+α] in FIG. 14. Four bit output data A<0> to A<3> correspond to the output data A[n+α] in FIG. 14. Data mask signals DMI<0> to DMI<3> are signals for bit-masking the write data to the A-port of the dual port RAM 1404, and the case where the signal is "1" indicates that there is a mask and the case where the signal is "0" indicates that there is no mask.

The input data I<0> to I<3> are inputted to exclusive negative logical sum circuits 1501 to 1504 via lockup registers having the same configuration as that of the circuit in FIG. 3, respectively. The output data A<0> to A<3> are inputted to the exclusive negative logical sum circuits 1501 to 1504 via registers having the same configuration as that of the circuit in FIG. 6, respectively. The data mask signals DMI<0> to DMI<3> are inputted to logical sum circuits 1505 to 1508 via lockup registers having the same configuration as that of the circuit in FIG. 3, respectively.

The exclusive negative logical sum circuit 1501 outputs "1" if the input data I<0> and the output data A<0> are the same, and outputs "0" if they are different. The exclusive negative logical sum circuit 1502 outputs "1" if the input data I<1> and the output data A<1> are the same, and outputs "0" if they are different. The exclusive negative logical sum circuit 1503 outputs "1" if the input data I<2> and the output data A<2> are the same, and outputs "0" if they are different. The exclusive negative logical sum circuit

1504 outputs "1" if the input data I<3> and the output data A<3> are the same, and outputs "0" if they are different.

The logical sum circuit 1505 outputs a logical sum signal of an output signal of the exclusive negative logical sum circuit 1501 and the data mask signal DMI<0>. The logical sum circuit 1506 outputs a logical sum signal of an output signal of the exclusive negative logical sum circuit 1502 and the data mask signal DMI<1>. The logical sum circuit 1507 outputs a logical sum signal of an output signal of the exclusive negative logical sum circuit 1503 and the data mask signal DMI<2>. The logical sum circuit 1508 outputs a logical sum signal of an output signal of the exclusive negative logical sum circuit 1504 and the data mask signal DMI<3>.

A logical product circuit 1509 outputs a logical product signal of output signals of the logical sum circuits 1505 and 1506. A logical product circuit 1510 outputs a logical product signal of output signals of the logical sum circuits 1507 and 1508. A logical product circuit 1511 outputs a logical product signal d_comp of output signals of the logical product circuits 1509 and 1510.

The write enable signal WEI of the A-port is inputted into a logical sum circuit 1512 via a lockup register having the same configuration as that of the circuit in FIG. 3. A chip enable signal CEIA of the A-port is inputted into the logical sum circuit 1512 via a lockup register having the same configuration as that of the circuit in FIG. 3. The logical sum circuit 1512 outputs a logical sum signal of the write enable signal WEI and the chip enable signal CEIA. An inverter 1513 outputs a logical inversion signal of an output signal of the logical sum circuit 1512. A logical product circuit 1517 outputs a logical product signal of an output signal of the inverter 1513 and a clock signal CKIA of the A-port.

A transmission gate 1514 receives input of the signal d_comp, and turns on if the output signal of the logical sum circuit 1512 is "0" and turns off if the output signal of the logical sum circuit 1512 is "1". A latch circuit 1515 has two inverters, latches an output signal of the transmission gate 1514, and outputs a logical inversion signal of the output signal. An inverter 1516 outputs a logical inversion signal of an output signal of the latch circuit 1515 as an identification signal ID. Ten registers 1518 constitute shift registers. The registers 1518 receive input of an output signal of the logical product circuit 1517 as a clock signal CK, latches the identification signal ID, and outputs the identification signal ID to the register 1518 at the next stage. Further, the latch data of the register 1518 is reset to "0" when a signal SET becomes "1". The ten registers 1518 shift the identification signal ID in synchronization with the clock signal CK and store the resultant signal. The ten registers 1518 store the identification signals ID corresponding to ten cycles. A logical product circuit 1519 outputs a logical product signal of output signals of the ten registers 1518 as the identification signal identify_2.

As illustrated in FIG. 2, the input data I[n+α] is outputted as the output data A[n+α] via the transmission gate 205 and the output latch circuit 204 at the write operation in the first-type dual port RAM 104. Namely, the input data I[n+α] and the output data A[n+α] are the same at the write operation in the first-type dual port RAM 104.

In contrast to the above, there is no transmission gate 205 in the second-type dual port RAM 804, so that the read data stored in the output latch circuit 204 is outputted as the output data A[n+α] at the write operation. Namely, the input data I[n+α] and the output data A[n+α] are not always the same but often different at the write operation in the second-type dual port RAM 804.

Further, if any one of the data mask signals DMI<0> to DMI<3> is "1", the write data is bit-masked, so that it is impossible to compare the input data I[n+α] and the output data A[n+α] for the masked bit.

Accordingly, in the case where all of the data mask signals DMI<0> to DMI<3> are "0", if the input data I<0> to I<3> and the output data A<0> to A<3> are the same, the identification signal d_comp becomes "1". In this case, the dual port RAM 1404 is estimated to be the first-type dual port RAM 104.

Further, in the case where all of the data mask signals DMI<0> to DMI<3> are "0", if the input data I<0> to I<3> and the output data A<0> to A<3> are different, the identification signal d_comp becomes "0". In this case, the dual port RAM 1404 is estimated to be the second-type dual port RAM 804.

Here, if any one of the data mask signals DMI<0> to DMI<3> is "1", the input data and the output data are regarded as coinciding with each other for the bit.

Further, the transmission gate 1514 turns on at the write operation and turns off at the read operation. As a result, as for the identification signal ID, "1" indicates the first-type dual port RAM 104 and "0" indicates the second-type dual port RAM 804.

At power-on, the signal SET becomes a positive pulse, and the latch data of the ten registers 1518 are initialized to "0". Thereafter, the ten registers 1518 store the identification signals ID corresponding to ten cycles. The logical product circuit 1519 outputs the logical product signal of output signals of the ten registers 1518 as the identification signal identify_2. As for the identification signal identify_2, "1" indicates the first-type dual port RAM 104 and "0" indicates the second-type dual port RAM 804. Also in the second-type dual port RAM 804, the identification signal ID corresponding to one cycle may become "1", but the probability that all of the identification signals ID corresponding to ten cycles become "1" is extremely low. For this reason, the ten registers 1518 and the logical product circuit 1519 are provided. If all of the identification signals ID corresponding to ten cycles are "1", the identification signal identify_2 becomes "1", and the dual port RAM 1404 is identified as being the first-type dual port RAM 104. Contrarily, if none of the identification signals ID corresponding to ten cycles are "1", the identification signal identify_2 becomes "0", and the dual port RAM 1404 is identified as being the second-type dual port RAM 804.

Note that immediately after power-on, the latch data of the ten registers 1518 are reset to "0", so that the identification signal identify_2 becomes "0" and the dual port RAM 1404 is identified as being the second-type dual port RAM 804. In this case, the B-port control circuit 1407 performs the same operation as that of the B-port control circuit 807 in the second embodiment. As illustrated in FIG. 12A and FIG. 12B, the B-port control circuit 807 in the second embodiment normally operates in both of the first-type dual port RAM 104 and the second-type dual port RAM 804.

Figure 16:
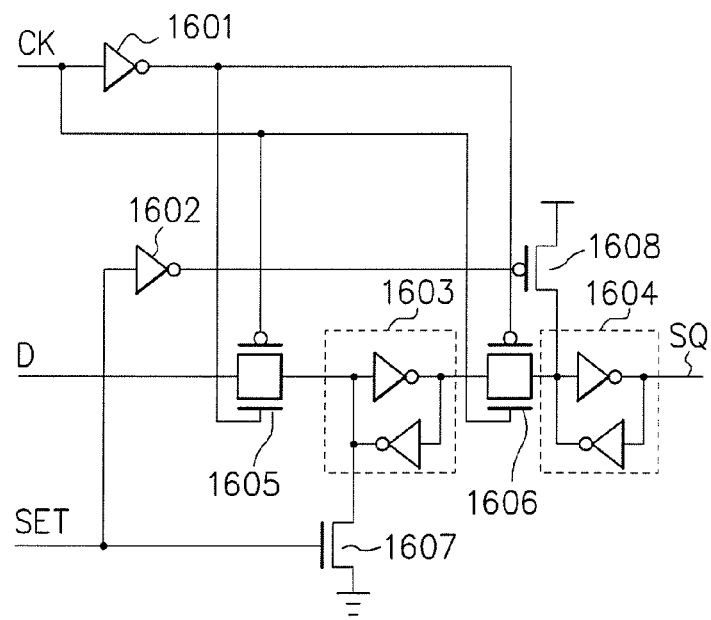
FIG. 16 is a diagram illustrating a configuration example of the register.

FIG. 16 is a diagram illustrating a configuration example of the register 1518 in FIG. 15. An inverter 1601 outputs a logical inversion signal of the clock signal CK. An inverter 1602 outputs a logical inversion signal of the signal SET. The signal SET becomes "1" for a short period at power-on, and then becomes "0". If the signal SET is "1", transistors 1607 and 1608 turn on, an input node of a master latch circuit 1603 is reset to "0", and an input node of a slave latch circuit 1604 is set to "1". As a result, the output data SQ becomes "0".

If the signal SET is "0", the transistors 1607 and 1608 turn off. A transmission gate 1605 receives input of the input data ID, and turns on when the clock signal. CK is at low level and turns off when the clock signal CK is at high level. A master latch circuit 1603 latches an output signal of the transmission gate 1605, and outputs a logical inversion signal of the output signal. A transmission gate 1606 receives input of an output signal of the master latch circuit 1603, and turns on when the clock signal CK is at high level and turns off when the clock signal CK is at low level. A slave latch circuit 1604 latches an output signal of the transmission gate 1606, and outputs a logical inversion signal of the output signal as the output data SQ.

Figure 17:
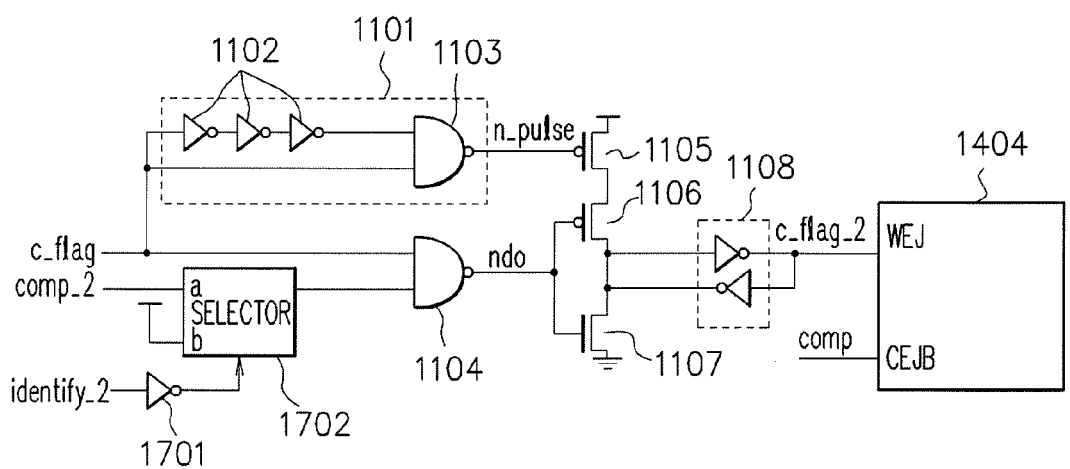
FIG. 17 is a diagram illustrating a configuration example of the B-port control circuit.

FIG. 17 is a diagram illustrating a configuration example of the B-port control circuit 1407 in FIG. 14. The B-port control circuit 1407 in FIG. 17 is made by adding an inverter 1701 and a selector 1702 to the B-port control circuit 807 in FIG. 11. Hereinafter, the points of the B-port control circuit 1407 in FIG. 17 different from the B-port control circuit 807 in FIG. 11 will be described. The inverter 1701 outputs a logical inversion signal of the identification signal identify_2. The selector 1702 outputs "1" if the identification signal identify_2 is "1", and outputs the signal comp_2 if the identification signal identify_2 is "0". The negative logical product circuit 1104 outputs the negative logical product signal ndo of an output signal of the selector 1702 and the error flag c_flag. Thus, the B-port control circuit 1407 performs the same operation as that of the B-port control circuit 107 in the first embodiment if the identification signal identify_2 is "1", and performs the same operation as that of the B-port control circuit 807 in the second embodiment if the identification signal identify_2 is "0".

In this embodiment, when the first-type dual port RAMs 104 and the second-type dual port RAMs 804 are mixedly mounted as in FIG. 13A or FIG. 13B, the type identification circuit 1408 can identify which one of the first-type dual port RAM 104 and the second-type dual port RAM 804 the dual port RAM 1404 is. The B-port control circuit 1407 can perform appropriate control according to the identification result.

(Fourth Embodiment)

Figure 18A:
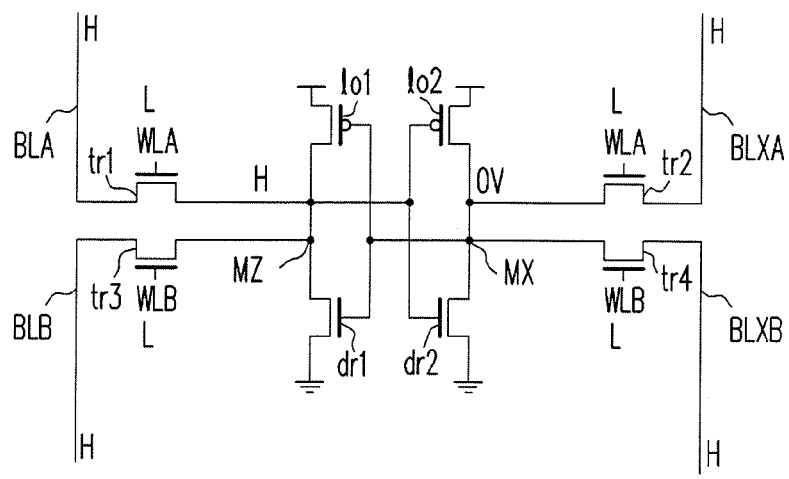
FIG. 18A to FIG. 18C are diagrams illustrating a memory cell of the dual port RAM.

FIG. 18A is a diagram illustrating a memory cell of the dual port RAM 104 in which none of the A-port and the B-port are accessed. The A-port has a pair of bit lines BLA, BLXA and transistors tr1, tr2. The B-port has a pair of bit lines BLB, BLXB and transistors tr3, tr4. P-channel field effect transistors lo1, lo2 and n-channel field effect transistors dr1, dr2 constitute a latch circuit. For example, a node MZ stores high level, and a node MX stores low level (0 V). If there is no access to the A-port, a word line WLA of the A-port becomes low level, and the transistors tr1, tr2 turn off. The bit lines BLA, BLXA have been pre-charged to high level. If there is no access to the B-port, a word line WLB of the B-port becomes low level, and the transistors tr3, tr4 turn off. The bit lines BLB, BLXB have been pre-charged to high level. Since the transistors tr1, tr2, tr3, tr4 have turned off, the data in the node MZ, MX are saved.

Figure 18B:
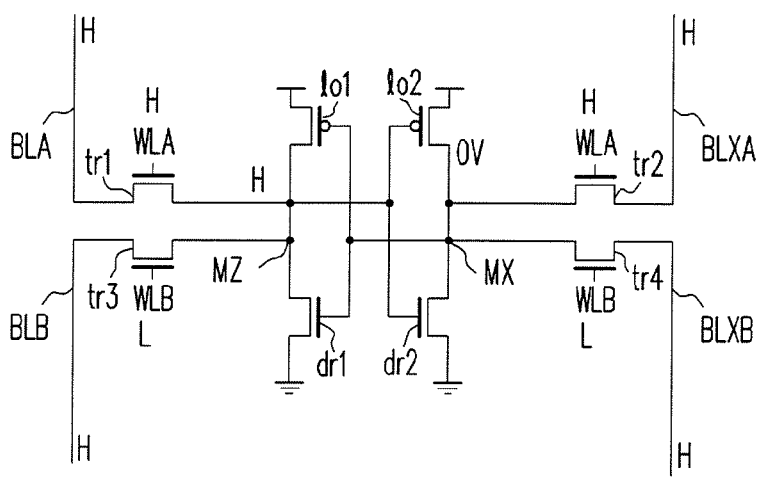

FIG. 18B is a diagram illustrating the memory cell of the dual port RAM 104 in which only the A-port is accessed. For example, the node MZ stores high level, and the node MX stores low level (0 V). The bit lines BLA, BLXA have been pre-charged to high level. If there is a read access to the A-port, the word line WLA of the A-port becomes high level, and the transistors tr1, tr2 turn on. Then, the bit line BLXA decreases in potential from high level and the node MX slightly increases in potential from 0 V, but the sizes of the transistors are set so that the node MX is kept at low level by the latch circuit constituted by the transistors lo1, lo2, dr1, dr2. The low level of the node MX is read to the bit line BLXA as described above.

Figure 18C:
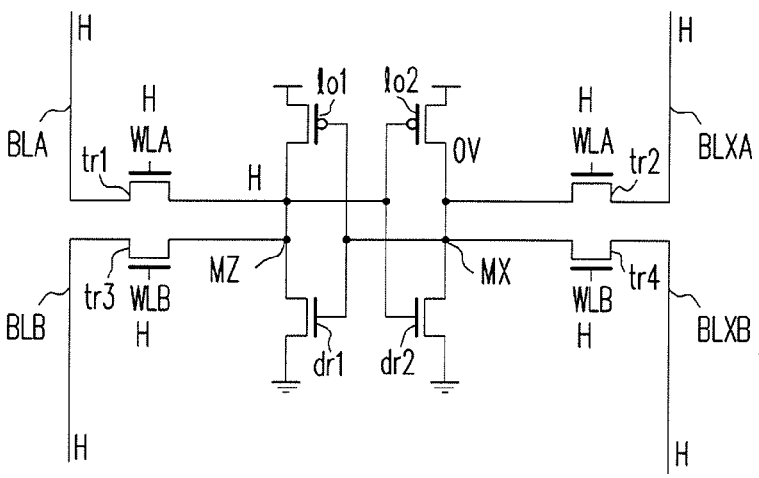

FIG. 18C is a diagram illustrating the memory cell of the dual port RAM 104 in which both of the A-port and the B-port are accessed. For example, the node MZ stores high level, and the node MX stores low level (0 V). The bit lines BLA, BLXA, BLB, BLXB have been pre-charged to high level. If there is a read access to the A-port, the word line WLA of the A-port becomes high level, and the transistors tr1, tr2 turn on. Further, if there is a (dummy read) access to the B-port, the word line WLB of the B-port becomes high level, and the transistors tr3, tr4 turn on. Then, the node MX is connected to both of the bit lines BLXA, BLXB, and the node MX relatively greatly increases from 0 V, as compared to the case of FIG. 18B. Then, the data stored in the node MX may be destroyed in some cases. Hereinafter, an embodiment for preventing the destruction of the data stored in the memory cell will be described.

FIG. 19 is a diagram illustrating a configuration example of a memory device according to a fourth embodiment. This embodiment (FIG. 19) is made by adding a delay circuit 1901 to the first embodiment (FIG. 1). Hereinafter, the points of this embodiment different from the first embodiment will be described. The delay circuit 1901 delays the output signal of the B-port control circuit 107, the address JB[m] of the B-port, and the input data J[n+α] of the B-port, and outputs the resultant to the dual port RAM 104. Thus, the access to the B-port can be delayed with respect to the access to the A-port. Even in the case of FIG. 18C, the word line WLA of the A-port and the word line WLB of the B-port can be deviated from each other in timing to become high level, thereby preventing the transistors tr1, tr2 from turning on concurrently with the transistors tr3, tr4. This makes it possible to prevent the destruction of the data stored in the memory cell. Further, it is unnecessary to increase the size of the transistors of the memory cell for the preventing the destruction of the stored data, thus making it possible to downsize the memory cell.

FIG. 20 is a diagram illustrating a configuration example of the delay circuit 1901 in FIG. 19. The delay circuit 1901 has a plurality of inverters 2001, and outputs a signal out made by delaying an input signal IN. The word lines WLA, WLB are controlled by a signal with a pulse width of 1 ns. The delay circuit 1901 adjusts timing so that the word line WLB of the B-port becomes high level after the word line WLA of the A-port becomes low level from high level.

(Fifth Embodiment)

Figure 21:
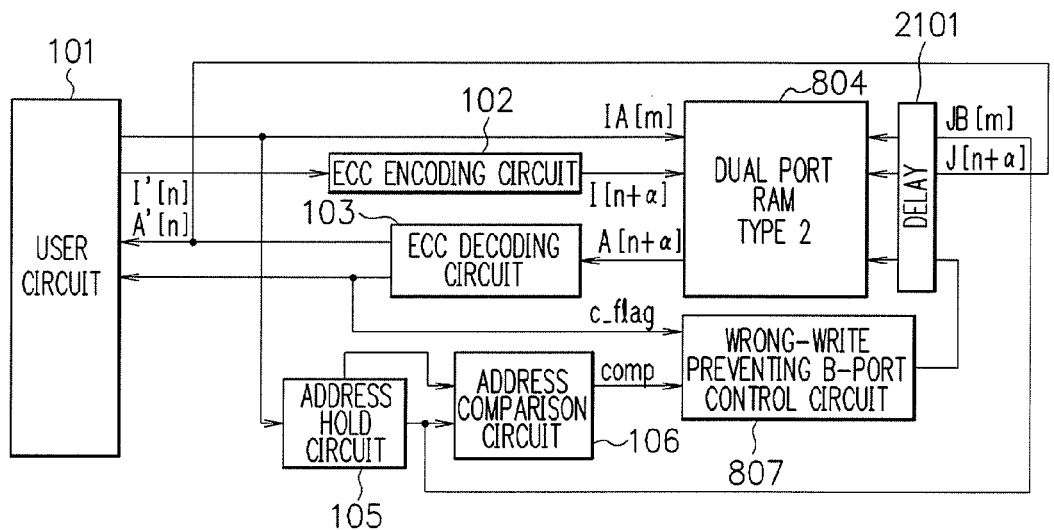
FIG. 21 is a diagram illustrating a configuration example of a memory device according to a fifth embodiment.

FIG. 21 is a diagram illustrating a configuration example of a memory device according to a fifth embodiment. This embodiment (FIG. 21) is made by adding a delay circuit 2101 to the second embodiment (FIG. 8). Hereinafter, the points of this embodiment different from the second embodiment will be described. The delay circuit 2101 delays the output signal of the B-port control circuit 807, the address JB[m] of the B-port, and the input data J[n+α] of the B-port, and outputs the resultant to the dual port RAM 804. Thus, the access to the B-port can be delayed with respect to the access to the A-port. Even in the case of FIG. 18C, the word line WLA of the A-port and the word line WLB of the B-port can be deviated from each other in timing to become high level, thereby preventing the transistors tr1, tr2 from turning on concurrently with the transistors tr3, tr4. This makes it possible to prevent the destruction of the data stored in the memory cell.

(Sixth Embodiment)

Figure 22:
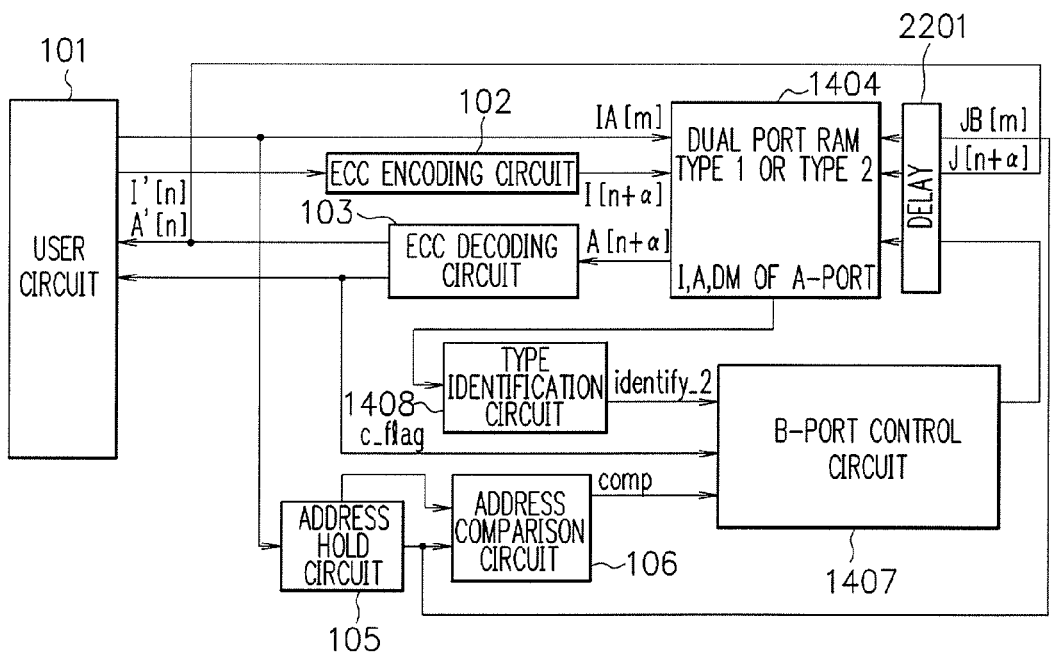
FIG. 22 is a diagram illustrating a configuration example of a memory device according to a sixth embodiment.

FIG. 22 is a diagram illustrating a configuration example of a memory device according to a sixth embodiment. This embodiment (FIG. 22) is made by adding a delay circuit 2201 to the third embodiment (FIG. 14). Hereinafter, the points of this embodiment different from the third embodiment will be described. The delay circuit 2201 delays the output signal of the B-port control circuit 1407, the address JB[m] of the B-port, and the input data J[n+α] of the B-port, and outputs the resultant to the dual port RAM 1404. Thus, the access to the B-port can be delayed with respect to the access to the A-port. Even in the case of FIG. 18C, the word line WLA of the A-port and the word line WLB of the B-port can be deviated from each other in timing to become high level, thereby preventing the transistors tr1, tr2 from turning on concurrently with the transistors tr3, tr4. This makes it possible to prevent the destruction of the data stored in the memory cell.

(Seventh Embodiment)

Figure 23:
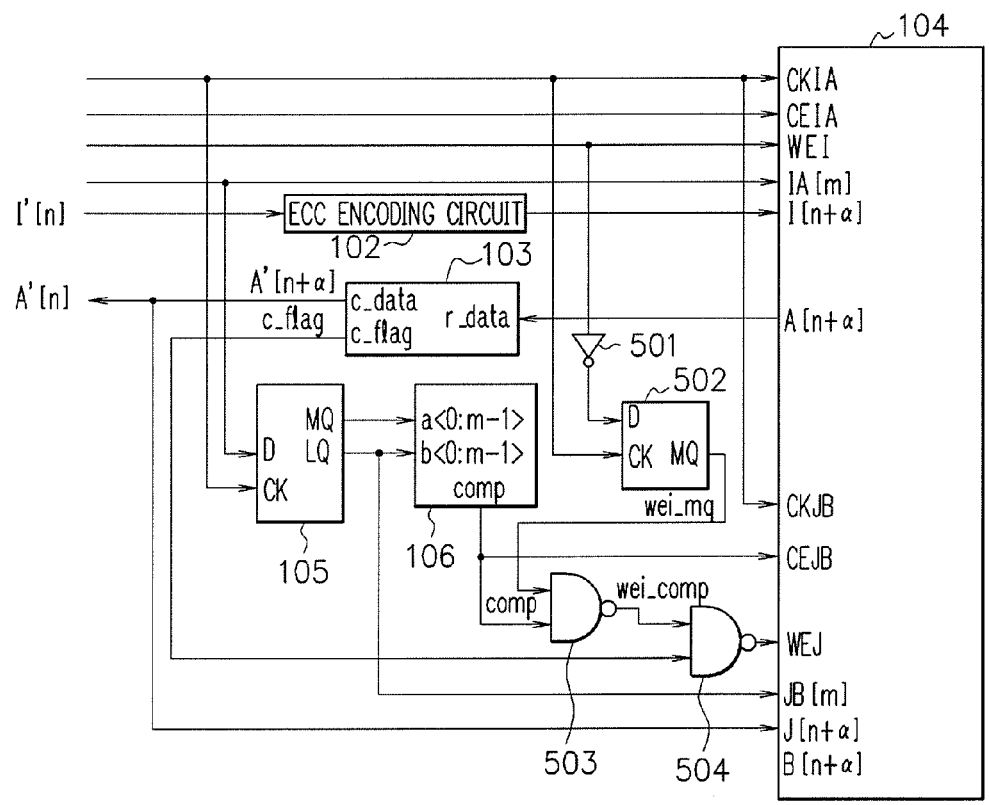
FIG. 23 is a diagram illustrating a configuration example of a memory device according to a seventh embodiment.

FIG. 23 is a diagram illustrating a configuration example of a memory device according to a seventh embodiment, illustrating a more specific example of the memory device in the first embodiment. Hereinafter, the points of this embodiment different from the first embodiment will be described. The dual port RAM 104 receives input of the clock signal CKIA of the A-port, the chip enable signal CEIA of the A-port, the write enable signal WEI of the A-port, the address IA[m] of the A-port, and the input data I[n+α] of the A-port, and outputs the output data A[n+α] of the A-port. The dual port RAM 104 further receives input of a clock signal CKJB of the B-port, the chip enable signal CEJB of the B-port, the write enable signal WEJ of the B-port, the address JB[m] of the B-port, and the input data J[n+α] of the B-port, and outputs output data B[n+α] of the B-port. The clock signal CKJB of the B-port is the same as the clock signal CKIA of the A-port.

FIG. 24 is a diagram illustrating a configuration example of the dual port RAM 104 in FIG. 23. A clock circuit 2401 receives input of the chip enable signal CEIA, the clock signal CKIA, and the write enable signal WEI of the A-port, and outputs a clock signal to a pre-decoder (address latch) 2402, a sense amplifier 2406, and a write amplifier 2405. The pre-decoder (address latch) 2402 latches the address IA[m] of the A-port, and outputs a pre-decode signal to a row decoder 2403 and outputs a column selection signal to a column selector 2404. The row decoder 2403 controls a word line wla of the A-port of a memory cell 2407. The memory cell 2407 has a plurality of the memory cells in FIG. 18A to FIG. 18C and stores data. The write amplifier 2405 amplifies the input data I[n+α] of the A-port. The column selector 2404 outputs the amplified write data to the column-selected memory cell 2407. The column selector 2404 further outputs the data read from the column-selected memory cell 2407 to the sense amplifier 2406. The sense amplifier 2406 amplifies the read data, and outputs the output data A[n+α] of the A-port.

A clock circuit 2411 receives input of the chip enable signal CEJB, the clock signal CKJB, and the write enable signal WEJ of the B-port, and outputs a clock signal to a pre-decoder (address latch) 2412, a sense amplifier 2416, and a write amplifier 2415. The pre-decoder (address latch) 2412 latches the address JB[m] of the B-port, and outputs a pre-decode signal to a row decoder 2413 and outputs a column selection signal to a column selector 2414. The row decoder 2413 controls a word line wlb of the B-port of the memory cell 2407. The write amplifier 2415 amplifies the input data J[n+α] of the B-port. The column selector 2414 outputs the amplified write data to the column-selected memory cell 2407. The column selector 2414 further outputs the data read from the column-selected memory cell 2407 to the sense amplifier 2416. The sense amplifier 2416 amplifies the read data, and outputs the output data B[n+α] of the B-port.

Figure 25:
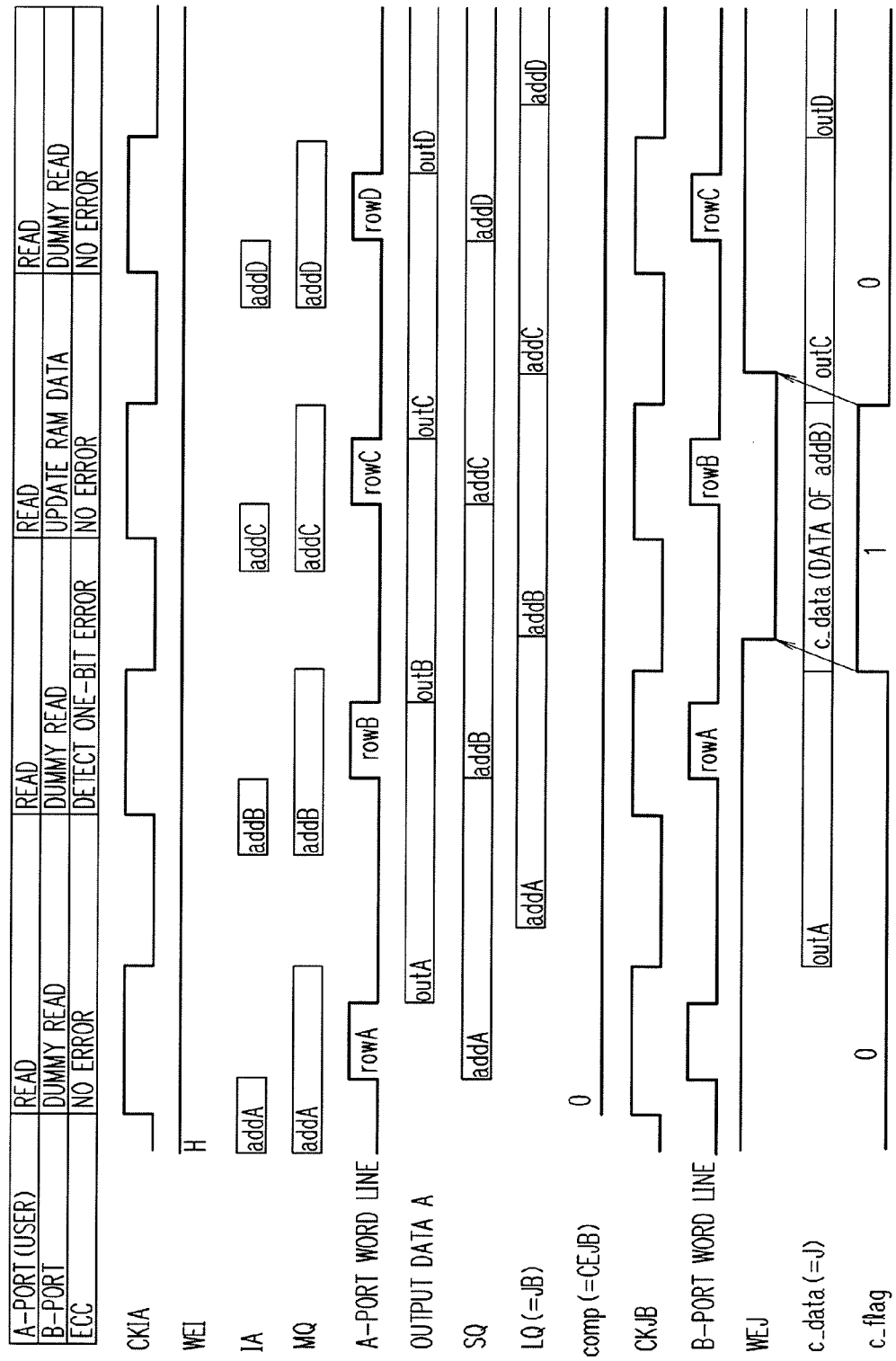
FIG. 25 is a timing chart in the case of writing corrected data.
Figure 26:
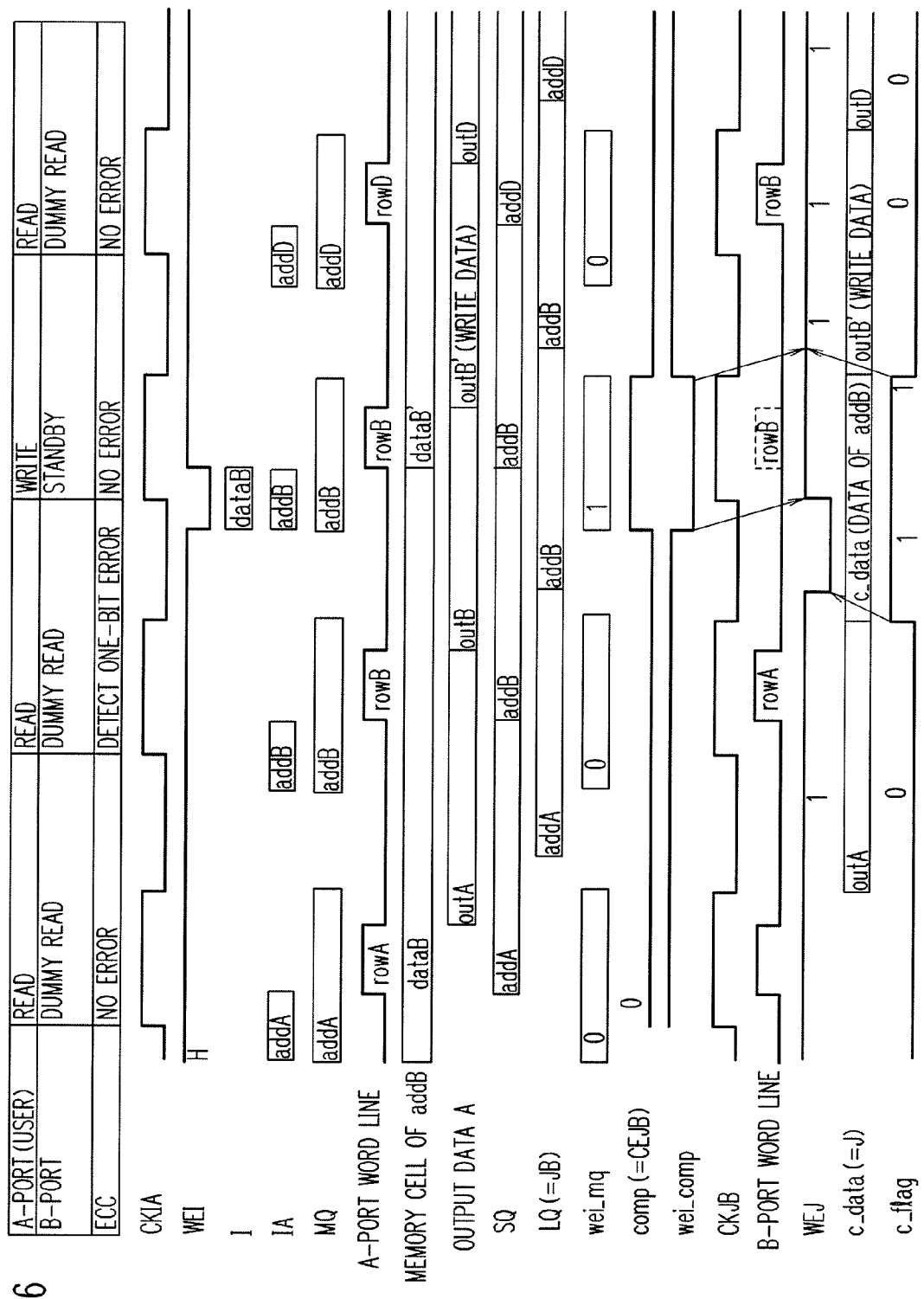
FIG. 26 is a timing chart in the case of inhibiting writing of the corrected data because of address coincidence.

FIG. 25 to FIG. 28 are timing charts illustrating the control method of the memory device in FIG. 23. FIG. 25 and FIG. 26 are timing charts in the case of using the first-type dual port RAM 104.

FIG. 25 is a timing chart in the case of writing the corrected data. First, in a first cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "0", the B-port of the dual port RAM 104 performs a dummy read operation.

Then, in a second cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in this cycle is "0", the B-port of the dual port RAM 104 performs a dummy read operation.

Then, in a third cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "1" and the coincidence signal comp is "0", the B-port of the dual port RAM 104 writes the corrected data J[n+α].

Then, in a fourth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "0", the B-port of the dual port RAM 104 performs a dummy read operation.

FIG. 26 is a timing chart in the case of inhibiting writing of the corrected data because of address coincidence. First, in a first cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "0", the B-port of the dual port RAM 104 performs a dummy read operation.

Then, in a second cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], detects a one-bit error, and outputs the error flag c_flag of "1" in the next cycle. Since the error flag c_flag in this cycle is "0", the B-port of the dual port RAM 104 performs a dummy read operation.

Then, in a third cycle, the address comparison circuit 106 outputs the coincidence signal comp of "1" as address coincidence. The A-port of the dual port RAM 104 performs a write operation according to a write command. By the write operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the coincidence signal comp is "1", the word line does not become high level, so that the B-port of the dual port RAM 104 does not write the corrected data J[n+α] but becomes a standby state. This makes it possible to avoid collision of accesses to the A-port and the B-port to the memory cell at the same address.

Then, in a fourth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "0", the B-port of the dual port RAM 104 performs a dummy read operation.

Figure 28:
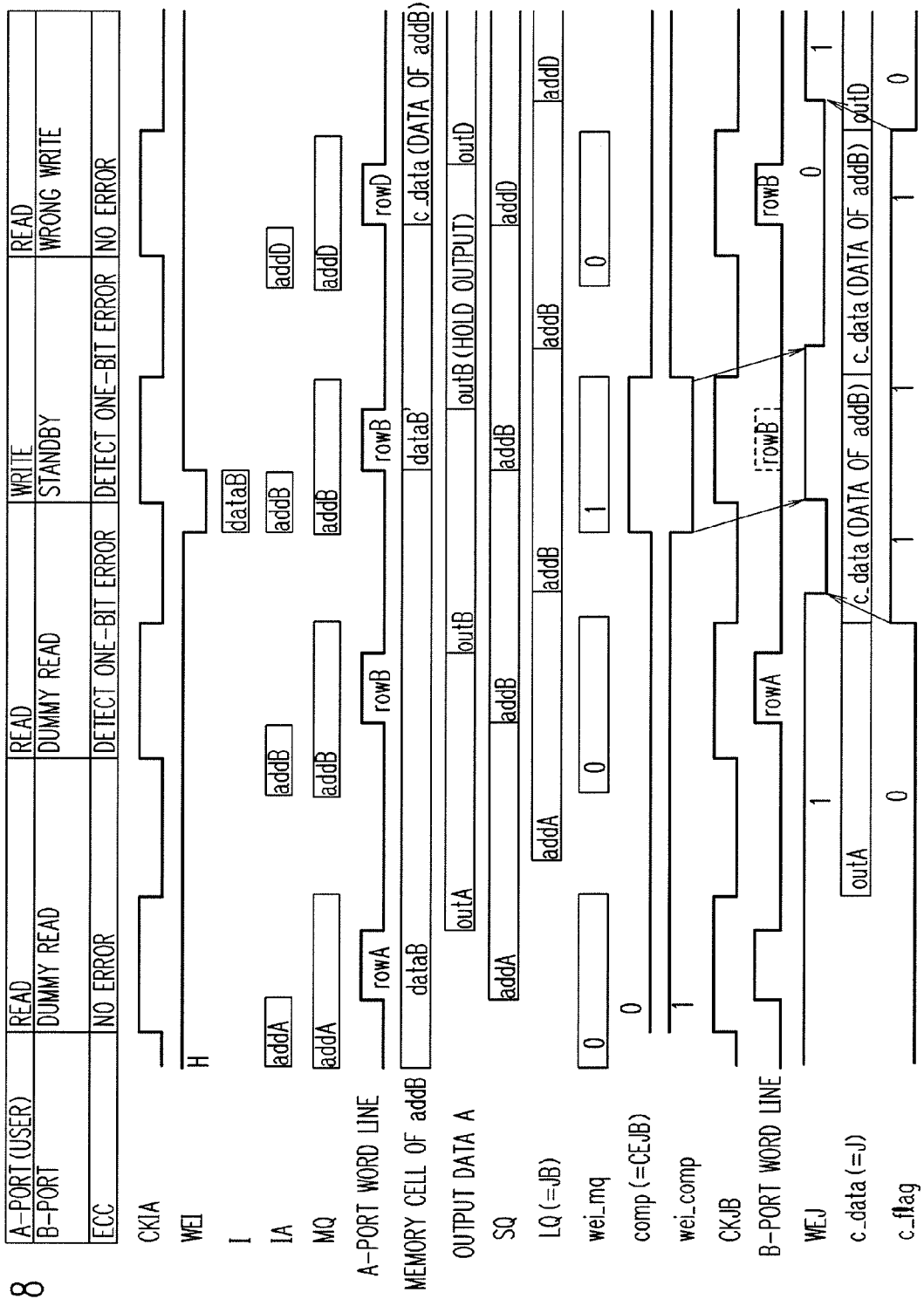
FIG. 28 is a timing chart in the case of inhibiting writing of the corrected data because of address coincidence.

FIG. 27 and FIG. 28 are timing charts in the case of using the second-type dual port RAM 804.

FIG. 27 is a timing chart in the case of writing the corrected data, illustrating the case where the A-port performs the same operation as that in FIG. 25. The operation in FIG. 27 is the same as that in FIG. 25 not only for the A-port but also for the B-port. In this case, the operation (FIG. 27) of the memory device using the second-type dual port RAM 804 is the same as the operation (FIG. 25) using the first-type dual port RAM 104.

FIG. 28 is a timing chart in the case of inhibiting writing of the corrected data because of address coincidence, illustrating the case where the A-port performs the same operation as that in FIG. 26. FIG. 28 is different in the third cycle and the fourth cycle from FIG. 26. Hereinafter, the points of FIG. 28 different from FIG. 26 will be described.

In a third cycle, the address comparison circuit 106 outputs the coincidence signal comp of "1" as address coincidence. The A-port of the dual port RAM 104 performs a write operation according to a write command. By the write operation, the output data A[n+α] of the A-port is not changed. Since the output data A[n+α] has not been changed, the ECC decoding circuit 103 does not make an error check on the output data A[n+α], but keeps the error flag c_flag of "1" in the next cycle. Since the coincidence signal comp is "1", the word line does not become high level, so that the B-port of the dual port RAM 104 does not write the corrected data J[n+α] but becomes a standby state. This makes it possible to avoid collision of accesses to the A-port and the B-port to the memory cell at the same address.

Then, in a fourth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle is "1" and the coincidence signal comp is "0", the word line becomes high level, so that the B-port of the dual port RAM 104 will write the corrected data J[n+α] of the read data in the second cycle over at the same address as the address of the data written to the A-port in the third cycle. This will erase the write data in the third cycle, and therefore the writing of the corrected data to the B-port in the fourth cycle is wrong write.

(Eighth Embodiment)

Figure 29:
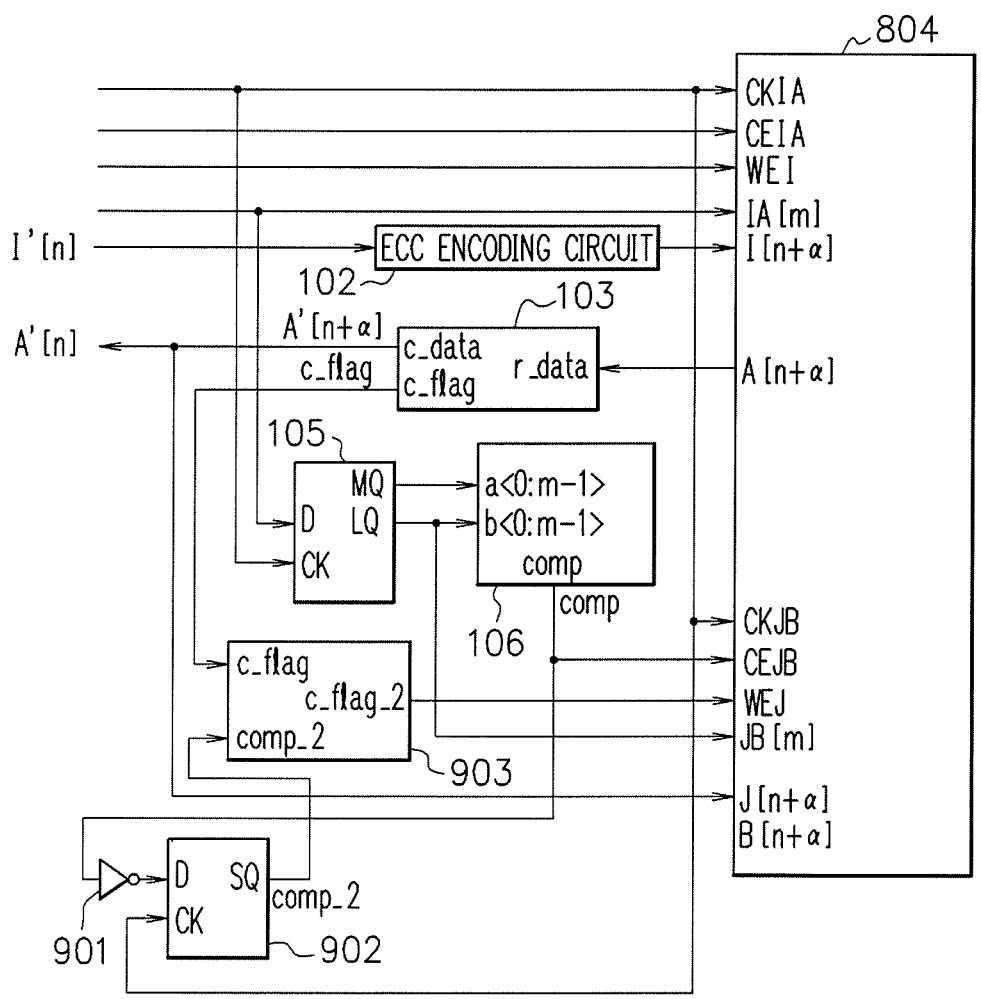
FIG. 29 is a diagram illustrating a configuration example of a memory device according to an eighth embodiment.

FIG. 29 is a diagram illustrating a configuration example of a memory device according to an eighth embodiment, illustrating a more specific example of the memory device in the second embodiment. Hereinafter, the points of this embodiment different from the second embodiment will be described. The dual port RAM 804 receives input of the clock signal CKIA of the A-port, the chip enable signal CEIA of the A-port, the write enable signal WEI of the A-port, the address IA[m] of the A-port, and the input data I[n+α] of the A-port, and outputs the output data A[n+α] of the A-port. The dual port RAM 804 further receives input of the clock signal CKJB of the B-port, the chip enable signal CEJB of the B-port, the write enable signal WEJ of the B-port, the address JB[m] of the B-port, and the input data J[n+α] of the B-port, and outputs the output data B[n+α] of the B-port. The clock signal CKJB of the B-port is the same as the clock signal CKIA of the A-port. The dual port RAM 804 has the same configuration as that of the dual port RAM 104 in FIG. 24.

Figure 30:
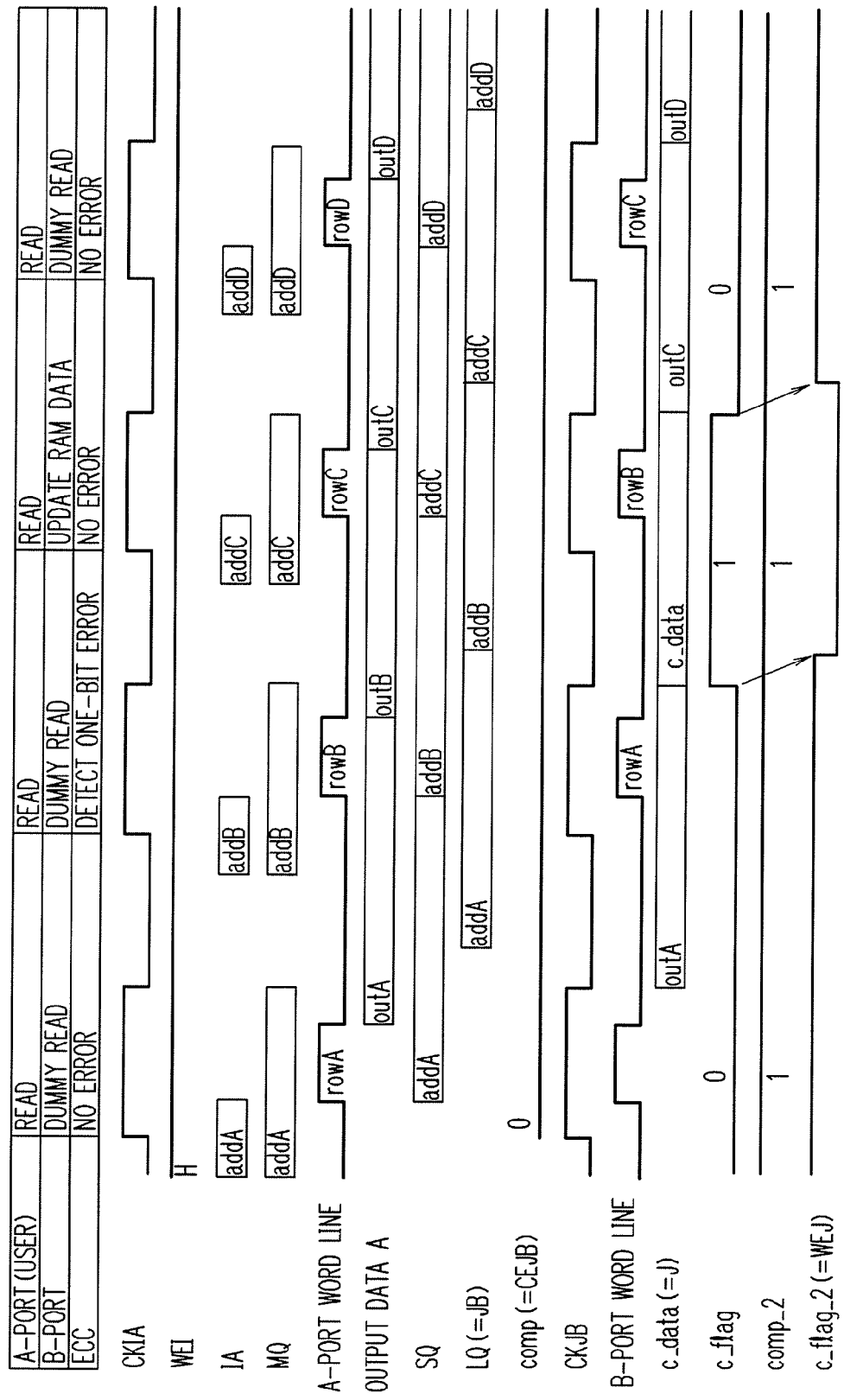
FIG. 30 is a timing chart in the case of writing the corrected data.
Figure 31:
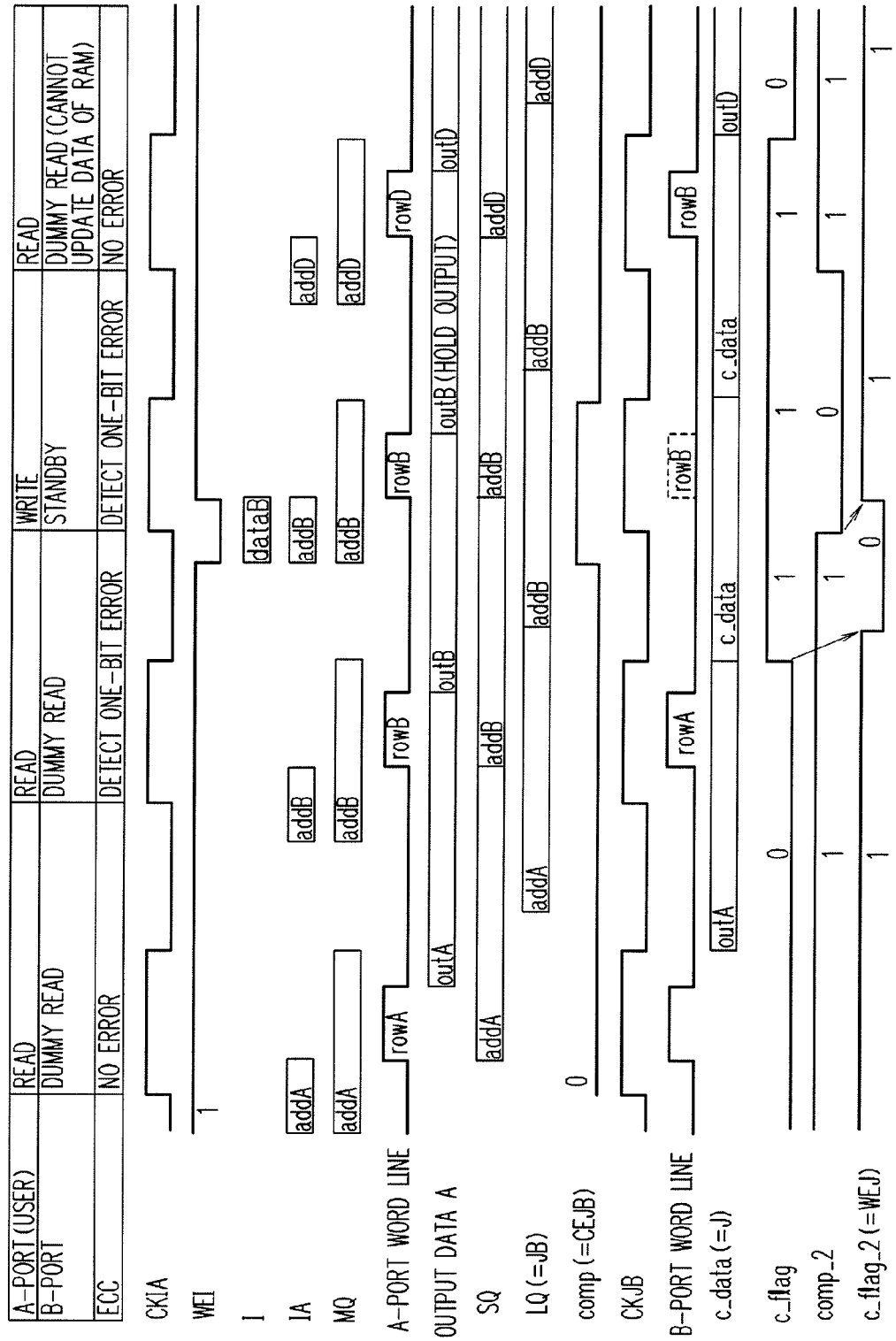
FIG. 31 is a timing chart in the case of inhibiting writing of the corrected data because of address coincidence.

FIG. 30 and FIG. 31 are timing charts illustrating the control method of the memory device in FIG. 29. FIG. 30 is a timing chart in the case of writing the corrected data. FIG. 30 is made by adding the signal comp_2 to FIG. 25. The signal comp_2 is a logical inversion signal of the coincidence signal comp. The operation in FIG. 30 is the same as that in FIG. 25.

FIG. 31 is a timing chart in the case of inhibiting writing of the corrected data because of address coincidence, illustrating the case where the A-port performs the same operation as that in FIG. 26. FIG. 31 is different in the third cycle and the fourth cycle from FIG. 26. Hereinafter, the points of FIG. 31 different from FIG. 26 will be described.

In a third cycle, the address comparison circuit 106 outputs the coincidence signal comp of "1" as address coincidence. The A-port of the dual port RAM 104 performs a write operation according to a write command. By the write operation, the output data A[n+α] of the A-port is not changed. Since the output data A[n+α] has not been changed, the ECC decoding circuit 103 does not make an error check on the output data A[n+α], but keeps the error flag c_flag of "1" in the next cycle. Since the coincidence signal comp is "1", the word line does not become high level, so that the B-port of the dual port RAM 104 does not write the corrected data J[n+α] but becomes a standby state.

This makes it possible to avoid collision of accesses to the A-port and the B-port to the memory cell at the same address.

Then, in a fourth cycle, the address comparison circuit 106 outputs the coincidence signal comp of "0" as address non-coincidence. The A-port of the dual port RAM 104 performs a read operation according to a read command. By the read operation, the output data A[n+α] of the A-port is changed. Since the output data A[n+α] has been changed, the ECC decoding circuit 103 makes an error check on the output data A[n+α], determines that there is no error, and outputs the error flag c_flag of "0" in the next cycle. Since the error flag c_flag in this cycle keeps "1" and has not been changed from "0" to "1", the write enable signal WEJ of the B-port becomes "1". Thus, the B-port of the dual port RAM 104 performs a dummy read operation. As a result, the wrong write as in the fourth cycle in FIG. 28 can be prevented.

(Ninth Embodiment)

Figure 32:
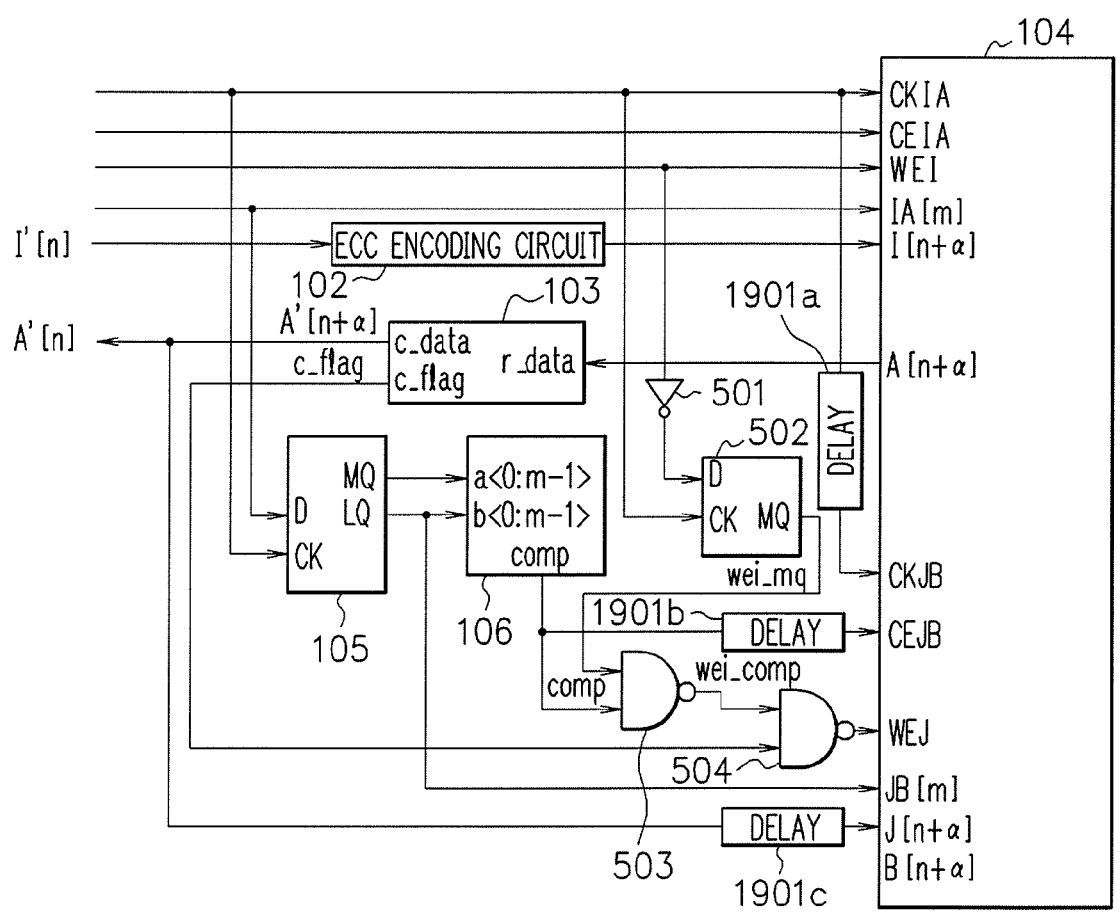
FIG. 32 is a diagram illustrating a configuration example of a memory device according to a ninth embodiment.

FIG. 32 is a diagram illustrating a configuration example of a memory device according to a ninth embodiment, illustrating a more specific example of the memory device in the fourth embodiment. Hereinafter, the points of this embodiment different from the fourth embodiment will be described. The memory device in FIG. 32 is made by adding delay circuits 1901*a* to 1901*c* to the memory device in FIG. 23. The delay circuits 1901*a* to 1901*c* correspond to the delay circuit 1901 in FIG. 19. The delay circuit 1901*a* delays the clock signal CKIA of the A-port and outputs the clock signal CKJB of the B-port. The delay circuit 1901*b* delays the coincidence signal comp, and outputs the chip enable signal CEJB of the B-port. The delay circuit 1901*c* delays data A'[n+α] outputted from the ECC decoding circuit 103, and outputs the input data J[n+α] of the B-port.

Figure 33:
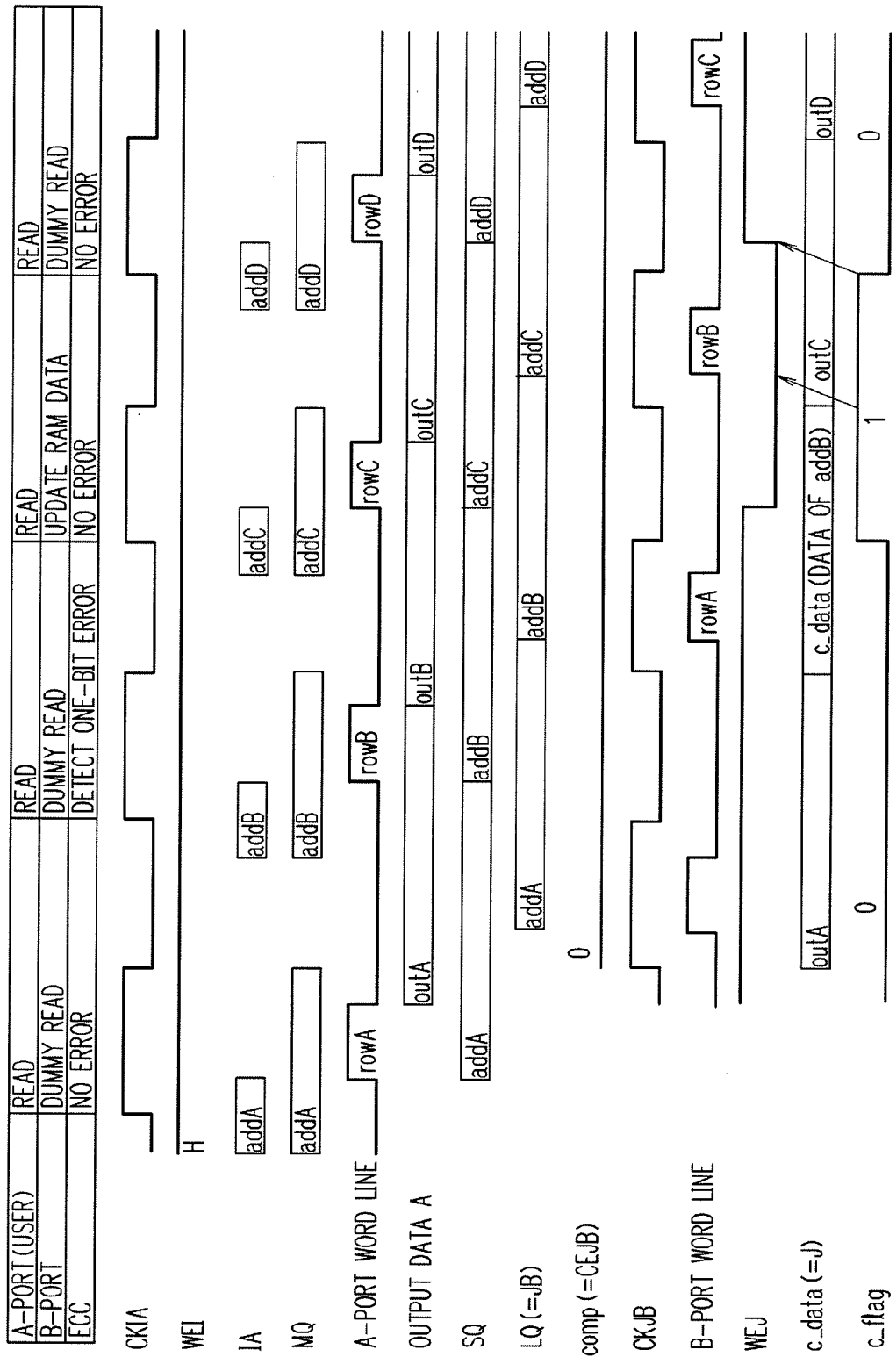
FIG. 33 is a timing chart in the case of writing the corrected data.

FIG. 33 and FIG. 34 are timing charts illustrating the control method of the memory device in FIG. 32. FIG. 33 corresponds to FIG. 25 and is a timing chart in the case of writing the corrected data. Hereinafter, the points of FIG. 33 different from FIG. 25 will be described. The delay circuits 1901*a* to 1901*c* delay the clock signal CKJB, the chip enable signal CEJB, and the input data J[n+α] of the B-port. Thus, the period when the word line of the B-port becomes high level is delayed from the period when the word line of the A-port becomes high level. The high level periods of both of them are mutually deviated and not overlapped with each other. Even in the case of FIG. 18C, it is possible to prevent the transistors tr1, tr2 from turning on concurrently with the transistors tr3, tr4 and prevent the destruction of the data stored in the memory cell.

FIG. 34 corresponds to FIG. 26 and is a timing chart in the case of inhibiting writing of the corrected data because of address coincidence. Hereinafter, the points of FIG. 34 different from FIG. 26 will be described. The delay circuits 1901*a* to 1901*c* delay the clock signal CKJB, the chip enable signal CEJB, and the input data J[n+α] of the B-port. Thus, the period when the word line of the B-port becomes high level is delayed from the period when the word line of the A-port becomes high level. The high level periods of both of them are mutually deviated and not overlapped with each other. Even in the case of FIG. 18C, it is possible to prevent the transistors tr1, tr2 from turning on concurrently with the transistors tr3, tr4 and prevent the destruction of the data stored in the memory cell.

(Tenth Embodiment)

FIG. 35 is a diagram illustrating a configuration example of a memory device according to a tenth embodiment, illustrating a more specific example of the memory device in the fifth embodiment. Hereinafter, the points of this embodiment different from the fifth embodiment will be described. The memory device in FIG. 35 is made by adding delay circuits 2201*a* to 2101*c* to the memory device in FIG. 29. The delay circuits 2101*a* to 2101*c* correspond to the delay circuit 2101 in FIG. 21. The delay circuit 2101*a* delays the clock signal CKIA of the A-port, and outputs the clock signal CKJB of the B-port. The delay circuit 2101*b* delays the coincidence signal comp, and outputs the chip enable signal CEJB of the B-port. The delay circuit 2101*c* delays the data A'[n+α] outputted from the ECC decoding circuit 103, and outputs the input data J[n+α] of the B-port.

Figure 36:
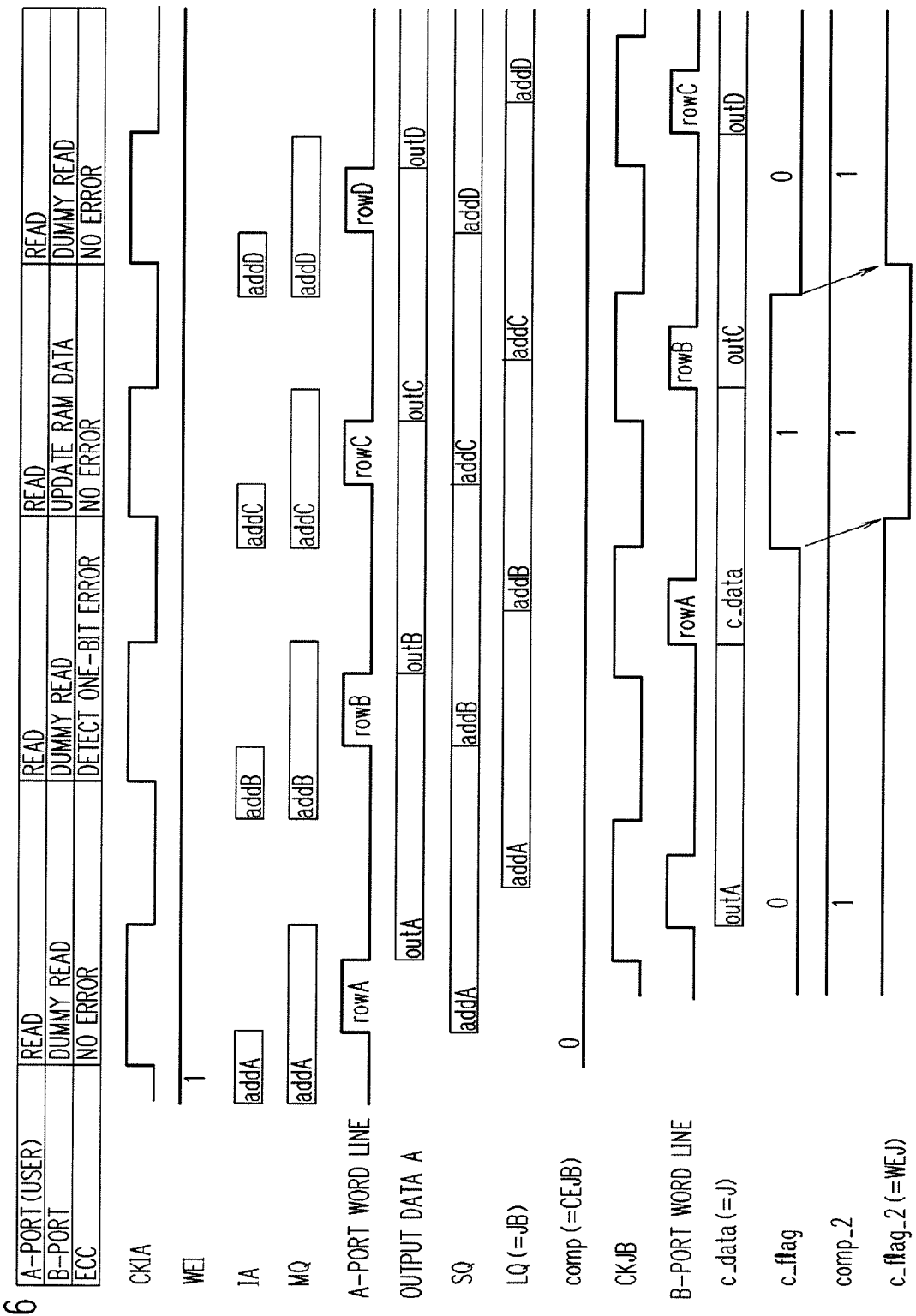
FIG. 36 is a timing chart in the case of writing the corrected data.
Figure 37:
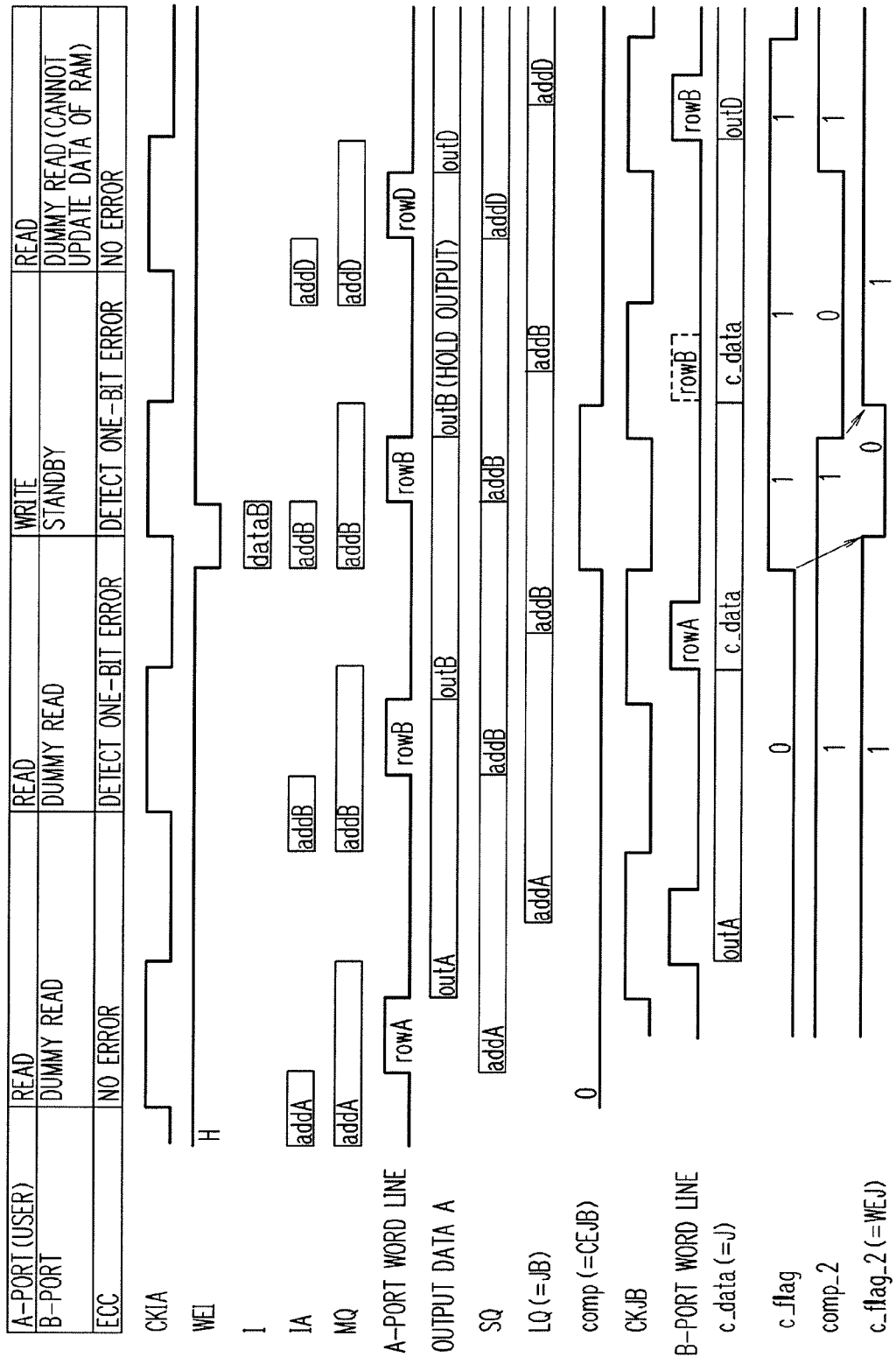
FIG. 37 is a timing chart in the case of inhibiting writing of the corrected data because of address coincidence.

FIG. 36 and FIG. 37 are timing charts illustrating the control method of the memory device in FIG. 35. FIG. 36 corresponds to FIG. 30 and is a timing chart in the case of writing the corrected data. Hereinafter, the points of FIG. 36 different from FIG. 30 will be described. The delay circuits 2101*a* to 2101*c* delay the clock signal CKJB, the chip enable signal CEJB, and the input data J[n+α] of the B-port. Thus, the period when the word line of the B-port becomes high level is delayed from the period when the word line of the A-port becomes high level. The high level periods of both of them are mutually deviated and not overlapped with each other. Even in the case of FIG. 18C, it is possible to prevent the transistors tr1, tr2 from turning on concurrently with the transistors tr3, tr4 and prevent the destruction of the data stored in the memory cell.

FIG. 37 corresponds to FIG. 31 and is a timing chart in the case of inhibiting writing of the corrected data because of address coincidence. Hereinafter, the points of FIG. 37 different from FIG. 31 will be described. The delay circuits 2101*a* to 2101*c* delay the clock signal CKJB, the chip enable signal CEJB, and the input data J[n+α] of the B-port. Thus, the period when the word line of the B-port becomes high level is delayed from the period when the word line of the A-port becomes high level. The high level periods of both of them are mutually deviated and not overlapped with each other. Even in the case of FIG. 18C, it is possible to prevent the transistors tr1, tr2 from turning on concurrently with the transistors tr3, tr4 and prevent the destruction of the data stored in the memory cell.

As described above, in the first to the tenth embodiments, the A-port of the dual port RAM is used by the user and the B-port of the dual port RAM is used for writing back the corrected data. There is a limitation in accesses to the A-port and the B-port to the same address. Therefore, in the case of the same address, the B-port is controlled to write back the corrected data to the B-port so as not to hinder the operation of the A-port. This can improve the reliability of the data stored in the memory device.

If a one-bit error is detected, preparation to write back the corrected data from the B-port to the dual port RAM in the next cycle is made. In the next cycle, the corrected data is not written back in the case of accesses to the same address, whereas the corrected data is written back only in the case of accesses to different addresses.

If a one-bit error is detected, in the case of temporarily stopping the access from the outside to the memory device and writing back the corrected data from the outside, the operation throughput decreases. According to the first to the tenth embodiments, the B-port control circuit controls the write back of the corrected data, so that it is unnecessary to stop the memory device from the outside, thus making it possible to improve the operation throughput.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

A control circuit writes corrected data to a memory, so that the reliability of data and the operation throughput can be improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A memory device, comprising:
a memory including a first port and a second port, the memory being configured to be accessed through the first port and the second port;
an error check and correct encoding circuit configured to apply an error check and correct code to data and to write the data and the error check and correct code into the memory through the first port;
an error check and correct decoding circuit configured to receive the data and the error check and correct code read from the first port, and corrects the data received when an error in the data received is detected based on the error check and correct code received; and
a control circuit configured not to write the data corrected and the error check and correct code into the memory through the second port when the error is detected and a current access address and a previous access address to the memory through the first port are the same, and to write the data corrected and the error check and correct code into the memory through the second port when the error is detected and the current access address and the previous access address to the memory through the first port are different.

2. The memory device according to claim 1,
wherein when output data of the first port of the memory has been changed, the error check and correct decoding circuit checks for an error in the output data, and sets an error flag when an error is detected and resets the error flag when no error is detected, and
wherein the control circuit writes, based on the error flag, the data corrected and the error check and correct code into the memory through the second port.

3. The memory device according to claim 2, wherein when write into the memory is instructed, the memory receives the data and the error check and correct code from the error check and correct encoding circuit through the first port, the data received and the error check and correct code received are written into the memory, and the memory outputs, from the first port, the data received and the error check and correct code received, and
wherein the control circuit writes the data corrected and the error check and correct code into the memory through the second port when the error flag is in a set state, and does not write the data corrected and the error check and correct code into the memory through the second port when the error flag is in a reset state.

4. The memory device according to claim 3, further comprising:
a delay circuit that delays the data and the error check and correct code outputted from the error check and correct encoding circuit, and outputs the data delayed and the error check and correct code delayed to the memory through the second port.

5. The memory device according to claim 2,
wherein when write into the memory is instructed, the memory receives the data and the error check and correct code from the error check and correct encoding circuit through the first port, the data received and the error check and correct code received are written into the memory, and the memory does not output, from the first port, the data received and the error check and correct code received but keeps the output data of the first port, and
wherein the control circuit writes the data corrected and the error check and correct code into the memory through the second port when the error flag has been changed from a reset state to a set state, and does not write the data corrected and the error check and correct code into the memory through the second port when the error flag keeps the set state.

6. The memory device according to claim 5, further comprising:
a delay circuit that delays the data and the error check and correct code outputted from the error check and correct encoding circuit, and outputs the data delayed and the error check and correct code delayed to the memory through the second port.

7. The memory device according to claim 2,
wherein the memory is a first-type or second-type memory,
wherein when write into the first-type memory is instructed, the first-type memory receives the data and the error check and correct code from the error check and correct encoding circuit through the first port, the data received and the error check and correct code received are written into the first-type memory, and the first-type memory outputs, from the first port, the data received and the error check and correct code received, and
wherein when write into the second-type memory is instructed, the second-type memory receives the data and the error check and correct code from the error check and correct encoding circuit through the first port, the data received and the error check and correct code received are written into the second-type memory, and the second-type memory does not output, from the first port, the data received and the error check and correct code received but keeps the output data of the first port,
wherein the memory device further comprises an identification circuit that identifies which one of the first-type memory and the second-type memory the memory is, on the basis of the output data of the first port of the memory and output data of the error check and correct encoding circuit,
wherein when the memory is the first-type memory, the control circuit writes the data corrected and the error check and correct code into the first-type memory through the second port when the error flag is in a set state, and does not write the data corrected and the error check and correct code into the first-type memory through the second port when the error flag is in a reset state, and wherein when the memory is the second-type memory, the control circuit writes the data corrected and the error check and correct code into the second-type memory through the second port when the error flag has been changed from the reset state to the set state, and does not write the data corrected and the error check and correct code into the second-type memory through the second port when the error flag keeps the set state.

8. The memory device according to claim 7, further comprising:

a delay circuit that delays the data and the error check and correct code outputted from the error check and correct encoding circuit, and outputs the data delayed and the error check and correct code delayed to the memory through the second port.

9. A control method of a memory device, the memory device comprising:

a memory having a first port and a second port, the memory being configured to be accessed through the first port and the second port;

an error check and correct encoding circuit configured to apply an error check and correct code to data and to write the data and the error check and correct code into the memory through the first port; and an error check and correct decoding circuit configured to receive the data and the error check and correct code read from the first port, and corrects the data received when an error in the data received is detected based on the error check and correct code received, the control method, comprising:

not writing, by a control circuit, the data corrected and the error check and correct code into the memory through the second port when the error is detected and a current access address and a previous access address to the memory through the first port are the same; and writing, by the control circuit, the data corrected and the error check and correct code into the memory through the second port when the error is detected and the current access address and the previous access address to the memory through the first port are different.

* * * * *